(12) United States Patent
Wang et al.

(10) Patent No.: US 10,782,233 B2
(45) Date of Patent: Sep. 22, 2020

(54) OPTICAL SENSING WITH CRITICALLY COUPLED PLANAR WAVEGUIDE WITH OPTIONAL INTEGRATION OF LAYERED TWO-DIMENSIONAL MATERIALS

(71) Applicant: The Regents of the University of California, Oakland, CA (US)

(72) Inventors: Feng Wang, Berkeley, CA (US); Jason Horng, Berkeley, CA (US); Halleh B. Balch, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 460 days.

(21) Appl. No.: 15/521,834

(22) PCT Filed: Mar. 13, 2017

(86) PCT No.: PCT/US2017/022151
§ 371 (c)(1),
(2) Date: Apr. 25, 2017

(87) PCT Pub. No.: WO2017/156534
PCT Pub. Date: Sep. 14, 2017

(65) Prior Publication Data
US 2018/0106724 A1    Apr. 19, 2018

Related U.S. Application Data

(60) Provisional application No. 62/307,369, filed on Mar. 11, 2016.

(51) Int. Cl.
*G01N 21/552* (2014.01)
*G01R 19/155* (2006.01)
(Continued)

(52) U.S. Cl.
CPC ......... *G01N 21/552* (2013.01); *G01R 19/155* (2013.01); *G01R 29/14* (2013.01); *G01N 2021/436* (2013.01); *G01R 29/0885* (2013.01)

(58) Field of Classification Search
CPC .. G01N 21/552; G01N 21/553; G01N 21/554; G01N 21/43; G01N 21/55;
(Continued)

(56) References Cited

U.S. PATENT DOCUMENTS 4,815,843 A * 3/1989 Tiefenthaler ......... G01N 21/431
356/128
4,877,747 A 10/1989 Stewart
(Continued)

FOREIGN PATENT DOCUMENTS

WO    WO-94-25850 A1    11/1994
WO    WO-2014118519 A1 *  8/2014 ........... G01N 21/554

OTHER PUBLICATIONS

Gan et al., "Strong enhancement of light-matter interaction in graphene coupled to a photonic crystal nanocavity," Nano Lett., 12, pp. 5626-5631 (2012).
(Continued)

*Primary Examiner* — Gordon J Stock, Jr.
(74) *Attorney, Agent, or Firm* — Venable LLP; Henry J. Daley

(57) ABSTRACT

An optical sensing system includes a planar optical waveguide having a first surface for detection and a second surface for coupling light. The optical sensing system includes a functional layer integral with the first surface of the planar optical waveguide, and a coupling layer in contact with the second surface of the planar optical waveguide, the coupling layer having a lower refractive index than the planar optical waveguide. The optical sensing system includes an optical source arranged to illuminate at least a
(Continued)

portion of the second surface of the planar optical waveguide through the coupling layer with substantially critical optical coupling. The optical sensing system also includes an optical detector arranged to receive a portion of light from the optical source after being reflected from the first surface of the planar optical waveguide and passing through the coupling layer.

19 Claims, 17 Drawing Sheets

(51) Int. Cl.
  *G01R 29/14* (2006.01)
  *G01R 29/08* (2006.01)
  *G01N 21/43* (2006.01)
(58) Field of Classification Search
  CPC ............ G01N 21/59; G01N 2021/434; G01N 2021/435; G01N 2021/436; G01N 2021/437; G01N 2021/438; G01N 2021/5903; G01R 29/00; G01R 29/08; G01R 29/0807; G01R 29/0864; G01R 29/0878; G01R 29/0885; G01R 29/12; G01R 29/14; G01R 19/0084; G01R 19/145; G01R 19/155; G01R 19/165; G01R 19/16533; C12Q 2565/628
  See application file for complete search history.

(56) References Cited

U.S. PATENT DOCUMENTS

| | | |
|---|---|---|
| 6,421,128 B1 | 7/2002 | Salamon et al. |
| 9,075,017 B2* | 7/2015 | Kasai .................... G01N 21/552 |
| 9,897,599 B2* | 2/2018 | Kanayama ....... G01N 33/54373 |
| 2004/0130723 A1 | 7/2004 | Yager et al. |
| 2009/0244542 A1 | 10/2009 | Cho et al. |
| 2011/0037981 A1* | 2/2011 | Zhu ...................... G01N 21/553 356/369 |
| 2011/0285999 A1* | 11/2011 | Kim .................... G01N 21/552 356/445 |
| 2013/0120752 A1* | 5/2013 | Lee .......................... G02B 6/02 356/445 |
| 2015/0177125 A1* | 6/2015 | Kasai ............... G01N 33/54333 422/69 |
| 2016/0146729 A1* | 5/2016 | Kehl .................... G01N 21/276 250/227.14 |
| 2017/0090077 A1* | 3/2017 | Geim ................... G01N 21/553 |
| 2019/0212263 A1* | 7/2019 | Chiu .................... G01N 21/553 |
| 2019/0361015 A1* | 11/2019 | Mendes ............... G01N 21/648 |

OTHER PUBLICATIONS

Liu et al., "Approaching total absorption at near infrared in a large area monolayer graphene by critical coupling," Appl. Phys. Lett., 105, pp. 181105-1-181102-4 (2014).
International Search Report and Written Opinion in International Application No. PCT/2017/022151, dated Jun. 5, 2017.

* cited by examiner

OPTICAL SENSING WITH CRITICALLY COUPLED PLANAR WAVEGUIDE WITH OPTIONAL INTEGRATION OF LAYERED TWO-DIMENSIONAL MATERIALS

This application is a U.S. National Phase Application under 35 U.S.C. § 371 of PCT/US2017/022151 filed Mar. 13, 2017, the entire content of which is hereby incorporated by reference and this application claims priority to U.S. Provisional Application Ser. No. 62/307,369, filed Mar. 11, 2016, the entire content of which is hereby incorporated by reference.

This invention was made with U.S. Government support under Grant No. 1344302, awarded by the National Science Foundation. The Government has certain rights in the invention.

BACKGROUND

1. Technical Field

The field of the currently claimed embodiments of this invention relates to optical sensing, and more particularly to optical sensing with a critically coupled planar waveguide.

2. Discussion of Related Art

Signaling and manipulation through the control of electric field distributions is ubiquitous to both biological and physical systems. For example, intercellular electrical activity is central to the signaling and computation of excitable cells such as cardiac and neuronal cells.[7] The voltages generated by bio-electric fields span three orders of magnitude and can fluctuate on the scale of microseconds to hours.[8,9] Likewise, the generation and manipulation of electric fields inside microscopic channels is the backbone of microfluidics and lab-on-a-chip diagnostics.[10,11] In the latter applications, electric field gradients are intentionally designed to create strong dielectrophoretic forces, which permit the trapping and control of individual chemical droplets or biological samples along programmable pathways covering hundreds of microns.[3,4,11]

Over the past decade, there has been a concerted effort to develop new techniques to observe and analyze the dynamic field fluctuations in liquids, such as the development of multitransistorarrays[12,13], voltage-sensitive dyes[14-18], and new computational paradigms to model[4,19,20] electric field behavior. However, it remains an outstanding challenge to achieve label-free, nonperturbativedetection with high field sensitivity and high spatio-temporal resolution. For example, the study of network-scale biological activity requires the ability to nonperturbatively record single-cell signals over a large field of view and with sub-millisecond temporal sensitivity. The predominant label-free method of detecting local electric fields across cellular networks are multielectrode and multitransistor arrays. These techniques require prefabricated electrode arrays that are difficult to scale up, are individually amplified, and do not provide the flexibility to measure electrical fields at arbitrary spatial positions. Compared to electrical techniques, optical imaging permits high throughput detection that is compatible with simultaneous complementary measurements. Despite these advantages, there is little research into label-free optical platforms that permit the spatio-temporal detection of electric field[22] distributions.

Rapid, high-throughput, and high-sensitivity detection techniques are of central utility to point-of-care diagnostics, environmental monitoring, materials engineering, lab-on-a-chip scalable devices, and biological and medical research. Notably, the extension of point measurements to two dimensional imaging and the ability to obtain high sensitivity detection of a suite of physical properties (e.g. acidity, stress, electrical field, molecular adsorption) on a single platform would offer unprecedented high-throughput information about spatial and temporal organization of these systems of interests.

Understanding the information transmitted through electric field distributions in biological systems is one of the major problems in both physiology and behavioral neurology. The voltages generated by bio-electric fields span three orders of magnitude and can fluctuate on the scale of microseconds to hours. Finding a method to extract all information in the intercellular electrical activity is difficult, and current techniques such as multielectrode and multitransistor arrays, calcium imaging, and voltage-sensitive dye fluorescence have limitations.

The adsorption of an analyte onto a surface results in a small change to the refractive at that location on a surface. The ability to detect small changes in refractive index permits the user to quantitatively detect the absorption of particles onto surfaces without altering the target system. A current manifestation of this capability is Surface Plasmon Resonance (SPR) wherein surface plasmon waves are excited in thin metal layers by light that is tuned to a very specific and narrow range of optical conditions. Upon analyte absorption to the metal layer, the resonance condition for the surface plasmon shifts, permitting the user to readout a detection event.

Some of the intrinsic properties of SPRs limit their performance. (1) The sensitivity of an SPR sensor is intrinsically limited by the large absorption losses of metals at optical frequencies. The damping of metal broadens the resonance linewidth and sets an ultimate sensitivity limit. (2) The SPR dispersion is determined by the properties of metals, therefore one cannot arbitrarily tune the probing wavelength or incident angle. (3) SPR signals vary with temperature sensitively which causes problems when the sample temperature is not stable or when a temperature dependence is considered.

SUMMARY

According to some embodiments of the invention, an optical sensing system includes a planar optical waveguide having a first surface for detection and a second surface for coupling light. The optical sensing system includes a functional layer integral with the first surface of the planar optical waveguide, and a coupling layer in contact with the second surface of the planar optical waveguide, the coupling layer having a lower refractive index than the planar optical waveguide. The optical sensing system includes an optical source arranged to illuminate at least a portion of the second surface of the planar optical waveguide through the coupling layer with substantially critical optical coupling. The optical sensing system also includes an optical detector arranged to receive a portion of light from the optical source after being reflected from the first surface of the planar optical waveguide and passing through the coupling layer.

According to some embodiments of the invention, a method of detecting a disturbance in an environment includes resonantly coupling light from an optical source into a two-dimensional waveguide having a detection surface and an optical coupling surface, the detection surface being in contact with the environment for detecting the disturbance. The method further includes detecting light emanating from the optical coupling surface, and observing the disturbance in the environment in contact with the detection surface of the two-dimensional waveguide based on the detected light.

BRIEF DESCRIPTION OF THE DRAWINGS

Further objectives and advantages will become apparent from a consideration of the description, drawings, and examples.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The terms optical, light, etc. refer to electromagnetic waves generally and not only to visible light. For example, the definitions of optical, light, etc. are intended to include, but are not limited to, infrared, visible, and ultraviolet light.

Figure 1A:
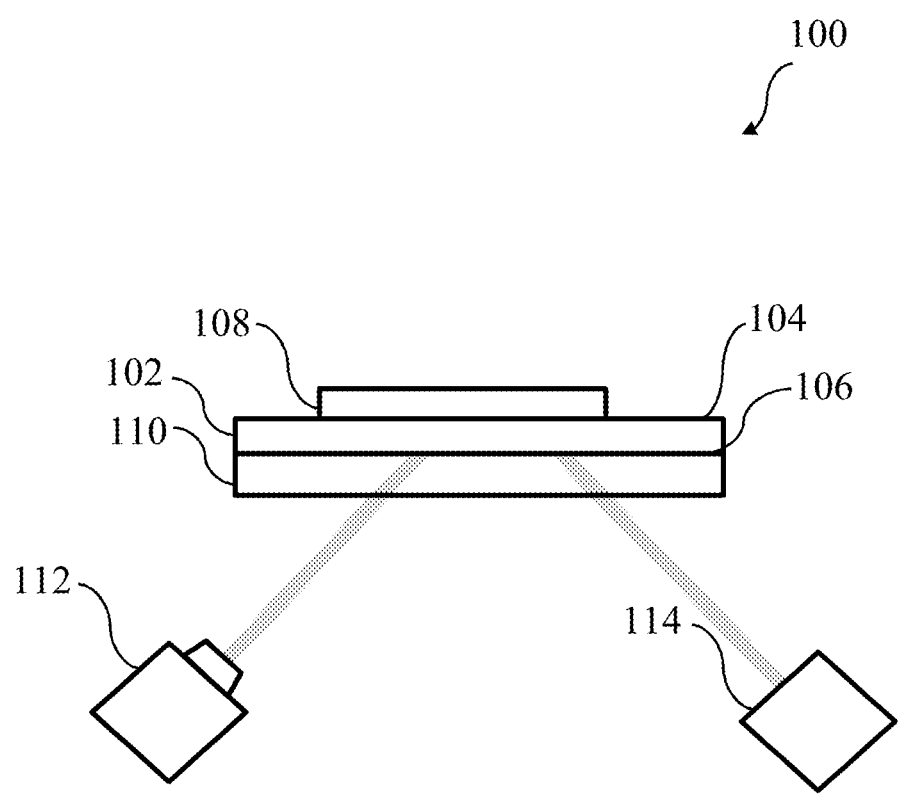
FIG. 1A illustrates an optical sensing system according to some embodiments of the invention.

An optical sensing system according to some embodiments of the invention shown in FIG. 1A. The optical sensing system 100 includes a planar optical waveguide 102 having a first surface 104 for detection and a second surface 106 for coupling light. The system 100 includes a functional layer 108 integral with the first surface 104 of the planar optical waveguide 102, and a coupling layer 110 in contact with the second surface 106 of the planar optical waveguide 102, the coupling layer 110 having a lower refractive index than the planar optical waveguide 102. The system 100 includes an optical source 112 arranged to illuminate at least a portion of the second surface 106 of the planar optical waveguide 102 through the coupling layer 110 with substantially critical optical coupling. The system 100 includes an optical detector 114 arranged to receive a portion of light from the optical source 112 after being reflected from the first surface 104 of the planar optical waveguide and passing through the coupling layer 110.

Figure 1B:
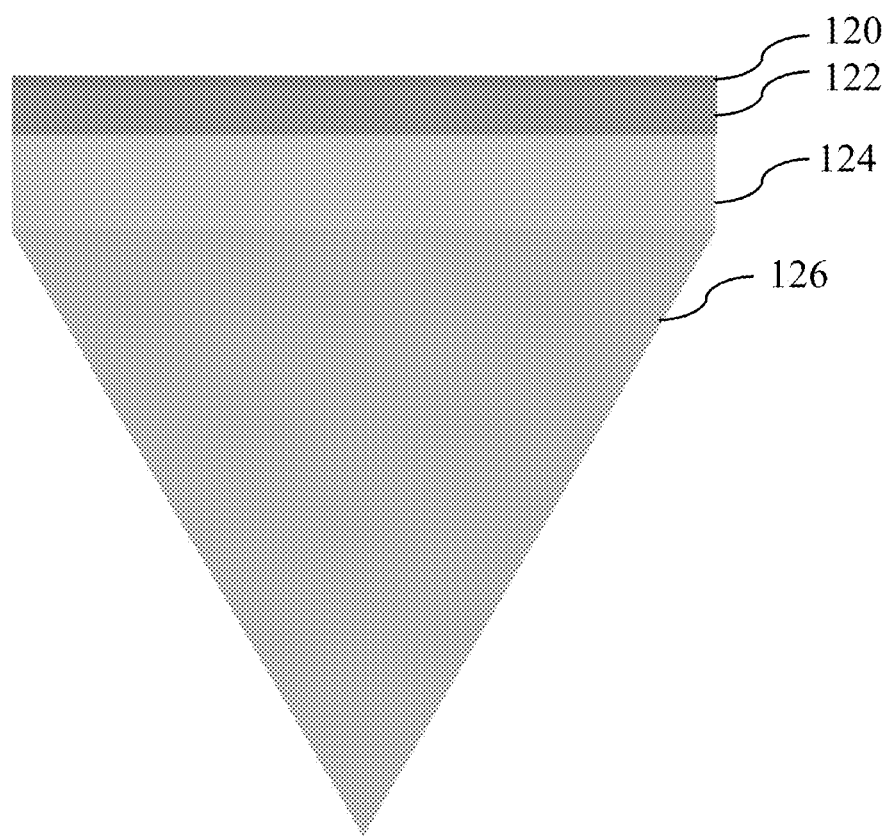
FIG. 1B illustrates an optical sensing system with a prism as a coupling tool.

An optical coupling tool, such as a prism or a grating, can be used to achieve the phase matching condition between the illumination light and the propagation mode in the planar optical waveguide 102. FIG. 1B shows an optical sensing system according to some embodiments in which the functional layer, 120, planar optical waveguide 122, and coupling layer 124 are disposed on top of a prism 126. The illumination light is then coupled into the planar optical waveguide 122 through the prism 126 and coupling layer 124 with frustrated total internal reflection. The coupling layer 124 is made of materials with lower refractive index than the planar waveguide 122. The thickness of the coupling layer 124 is designed to achieve optimal sensitivity for different sensing purposes. The reflected light is then coupled to the optical detector through the same coupling layer 124 and coupling tool 126 for recording.

Figure 1C:
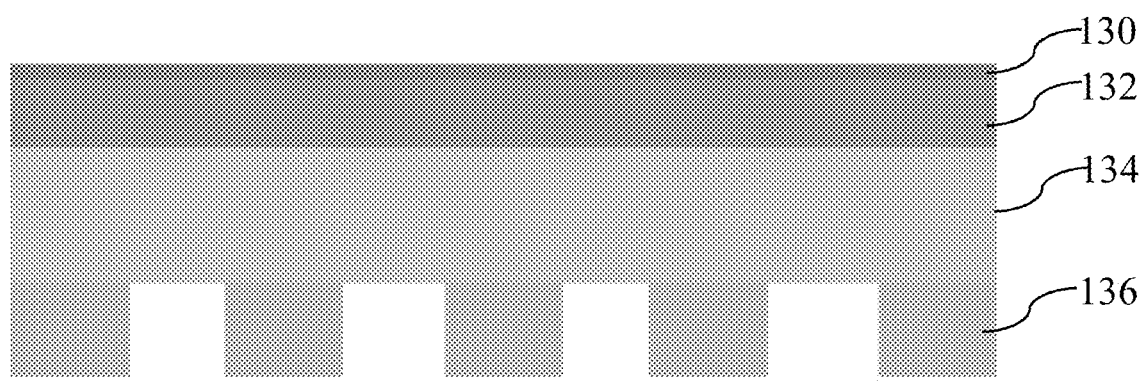
FIG. 1C illustrates an optical sensing system with a grating as a coupling tool.

FIG. 1C shows an optical sensing system according to some embodiments in which the functional layer, 130, planar optical waveguide 132, and coupling layer 134 are disposed on top of a grating 136. The reflected light is coupled to the optical detector through the coupling layer 134 and coupling tool 136 for recording.

The optical sensing system can be used to observe a target. The target can be brought close to the functional layer, and its physical properties, such as electric potential, strain, chemical concentration, etc., can modulate the optical absorption or the refractive index of the functional layer. As the light propagates in the planar waveguide, the intensity as well as the phase of electromagnetic waves can be sensitively modulated by the refractive index and the optical absorption of the functional layer. The perturbation in the functional layer therefore causes a change in the magnitude or phase of reflected light. The change of reflected light is enhanced by the planar waveguide to achieve highly sensitive detection.

Some embodiments of the invention further include an objective to image the functional layer surface to an array optical detector for parallel detection and high speed monitoring. The optical platform presented is easy to use and can allow high detection sensitivity, high spatial resolution, parallel detection, and high speed simultaneously. Some advantages of this platform are the following: (1) the optical sensing sensitivity is increased by orders of magnitude by pairing the critical coupling condition with a planar waveguide; (2) pairing two-dimensional materials with the planar waveguide permits unique two-dimensional optical metrology of stimulants that modify the optical responses of the two-dimensional layered materials; and (3) the platform is compatible with optical microscopy and imaging, which allows for highly parallel sensing with excellent spatial resolution and video rate imaging.

According to some embodiments of the invention, the functional layer is a two-dimensional material layer or a layer with specific chemical, biological, or physical (electrical, magnetic, geometric or other) affinity. Two-dimensional materials according to some embodiments can be defined as single or multiple layers of van der Waals interacted materials. According to some embodiments, two-dimensional materials are crystalline materials within a two-dimensional plane with a thickness of a few nanometers or less. Two stacked two-dimensional material layers usually interact with Van der Waals forces.

According to some embodiments of the invention, the optical sensing system includes a voltage source electrically connected to the two-dimensional material layer for providing electrical gating and allowing application of gate-variable optical properties of the two-dimensional material layer.

According to some embodiments of the invention, the optical detector is an imaging detector to detect light from identifiable locations across a portion of a surface of said planar optical waveguide.

According to some embodiments of the invention, the functional layer is responsive to at least one environmental physical, chemical, or biological parameter to be detected. According to some embodiments, the functional layer is a graphene layer.

According to some embodiments of the invention, the optical detector is configured to provide two-dimensional imaging of an electric field proximal to the functional layer based on the received portion of light. According to some embodiments of the invention, the optical detector can be a single-element photodiode, photo multiplier, or a two-dimensional optical detector.

According to some embodiments of the invention, the planar optical waveguide comprises a layer of $Ta_2O_5$. According to some embodiments of the invention, the layer of $Ta_2O_5$ has a thickness of about 150 nm.

According to some embodiments of the invention, a surface of the functional layer that is opposite to the surface that is integral with the first surface of said planar optical waveguide is in contact with a solution, and the optical sensing system provides two-dimensional time-resolved imaging of an electric field distribution in the solution.

According to some embodiments, the optical sensing system has a voltage sensitivity of at least 15 mV. According to some embodiments, the optical sensing system has a spatial resolution of at least 16 µm. According to some embodiments, the optical sensing system has a spatial resolution of at least 10 µm.

According to some embodiments of the invention, the optical sensing system further comprises a coupling tool, and the coupling tool optically couples the planar optical waveguide to the optical source and the optical detector. According to some embodiments of the invention, the coupling tool is a prism or a diffraction grating. According to some embodiments, the coupling layer comprises $SiO_2$. According to some embodiments, the functional layer has a surface area of at least 1 $cm^2$. According to some embodiments, the functional layer is at least two two-dimensional material layers stacked on top of each other.

According to some embodiments of the invention, the optical sensing system further comprises a translational stage on which the planar optical waveguide and functional layer are mounted, and the optical detector is a one-dimensional detector.

According to some embodiments of the invention, the planar optical waveguide comprises a slab of high refractive index materials, such as but not limit to $Ta_2O_5$ and Si3N$_4$. The thickness of the planar optical waveguide depends on the designed light wavelength and coupling methods.

A method of detecting a disturbance in an environment according to some embodiments of the invention includes resonantly coupling light from an optical source into a two-dimensional waveguide having a detection surface and an optical coupling surface, the detection surface being in contact with the environment for detecting the disturbance. The method further includes detecting light emanating from the optical coupling surface, and observing the disturbance in the environment in contact with the detection surface of the two-dimensional waveguide based on the detected light.

The method according to some embodiments further includes forming a two-dimensional image providing a location the disturbance therein based on the detected light. The disturbance can be change in at least one of an environmental physical, mechanical, chemical, or biological parameter to be detected. Observing the disturbance in the environment in contact with the detection surface of the two-dimensional waveguide based on the detected light can include observing a change in a refractive index of at least a portion of the two-dimensional waveguide due to the disturbance in the environment.

According to some embodiments of the invention, a surface of the functional layer that is opposite to the surface that is integral with a surface of the planar optical waveguide is in contact with a solution, and the optical sensing system provides two-dimensional time-resolved imaging of an electric field distribution in the solution.

According to some embodiments of the invention, the optical sensing system further comprises a prism (FIG. 1B) or a grating (FIG. 1C), and the prism or grating optically couples the planar optical waveguide to the optical source and the optical detector. According to some embodiments, the optical sensing system further comprises a coupling layer with low refractive index, such as but not limit to $SiO_2$ and $MgF_2$. The coupling layer is disposed on a surface of the prism or grating, and the planar optical waveguide is disposed on the coupling layer.

According to some embodiments of the invention, the optical sensing system further comprises an infrared objective, and the infrared objective is arranged to receive light from the planar optical waveguide and transmit the received light to the optical detector.

As used herein, the term "about" when referring to a measurable value such as an amount, a temporal duration, and the like, is meant to encompass variations of ±20% or ±10%, more preferably ±5%, even more preferably ±1%, and still more preferably ±0.1% from the specified value, as such variations are appropriate to perform the disclosed methods.

First Embodiment—Operation with Critical Coupling Condition

Some embodiments of the invention pair the optical critical coupling condition with a planar waveguide for a versatile and high sensitivity optical sensing platform at two-dimensional surfaces and interfaces. In this scheme, an absorptive sheet of two-dimensional material is deposited on the planar waveguide as the functional layer. The thickness of coupling layer, which determines the coupling efficiency through frustrated total internal reflection, is fine-tuned to achieve the so-called critical coupling condition. The light can be efficiently absorbed by the functional layer under the critical coupling condition, which leads to minimal reflectance from the planar waveguide. A modification of absorption in the functional layer due to environmental perturbation breaks the critical coupling condition and leads to a greatly enhanced optical signal. The sensor operating near to the critical coupling condition can be tailored to have excellent sensitivity due to very low reflection background.

As used herein, the terms "substantially critical optical coupling" and "near to critical optical coupling" are intended to mean sufficiently close to the critical optical coupling condition to achieve the intended purpose. According to some embodiments, substantially critical optical coupling is intended to mean coupling wherein R is less than 5%. According to some embodiments, substantially critical optical coupling is intended to mean coupling wherein R is less than 2.5%. According to some embodiments, substantially critical optical coupling is intended to mean coupling wherein R is about 0.63%.

Description of the Critical Coupling

Figure 2:
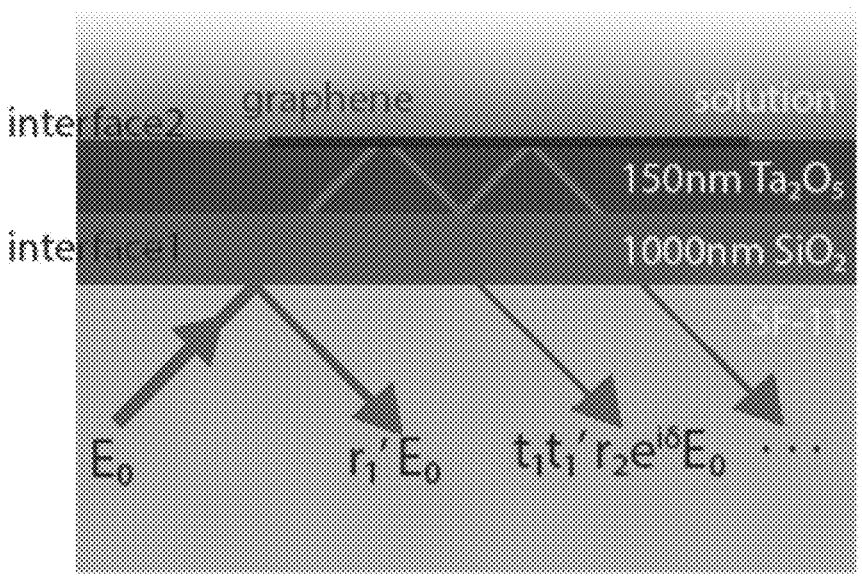
FIG. 2 shows details of the waveguide structure and critical coupling according to some embodiments.
Figure 2:
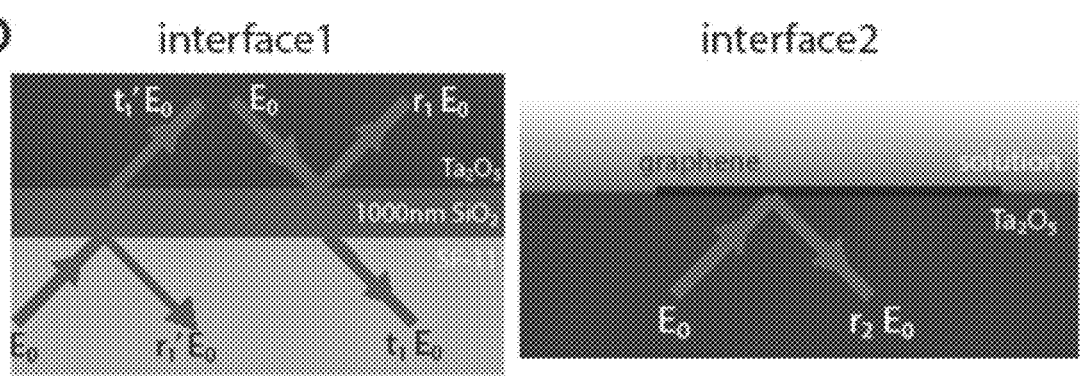

FIG. 2 shows a realization of the platform according to some embodiments of the invention. Panel (a) shows the geometry of the layered structure (not in scale) with the multiple reflection analysis. Interface1 and interface2 are highly reflective and form a Fabry-Perot cavity. The definitions of $r'_1$, $r_2$, $t_1$, $t'_1$ are given in panel (b) and are described in more detail below. Panel (b) shows the two sub-systems considered: interface1 comprises coupling tool/coupling layer/waveguide and interface2 comprises waveguide/functional layer/solution. Both of them form a highly reflecting mirror.

The interface1 sub-system can be treated by standard methods of frustrated total internal reflection (FTIR). Here, we assume the reflection and transmission coefficients for light incident from the coupling tool side are $r_1'$ and $t_1'$, while the coefficients from the waveguide side are $r_1$ and $t_1$. At the interface2, $r_2$ is defined as the reflection coefficient for light incident from the waveguide side of the interface. Both reflection coefficients $|r_1|$ and $|r_2|$ at the two interfaces is about 100% but deviates from 100% due to the frustrated total internal reflection from the finite coupling layer thickness at the first interface and the absorption of functional layer at the second interface. The two sub-systems are highly reflective and may be described together as a Fabry-Perot cavity. The resonance of the Fabry-Perot cavity depends sensitively on the incident angle, allowing one to find the resonance of the Fabry-Perot cavity by varying the incident angle coupling into the waveguide structure. At resonance coupling, the total reflection R from the Fabry-Perot cavity is described by $$R = \frac{(|r_1| - |r_2|)^2}{(1 - |r_1||r_2|)^2}.$$

The critical coupling condition happens at $|r_1|=|r_2|$, at which the reflection intensity dramatically decreases and light has near-100% absorption into the functional layer. Operating the device at the critical condition can enhance the sensitivity significantly due to low reflection background.

Example 1—Graphene Electric Field Sensor

Signaling and manipulation through the control of electric field distributions is ubiquitous to both biological and physical systems. For example, intercellular electrical activity is central to the signaling and computation of excitable cells such as cardiac and neuronal cells. The voltages generated by bio-electric fields span three orders of magnitude and can fluctuate on the scale of microseconds to hours.[8,9] Likewise, the generation and manipulation of electric fields inside microscopic channels is the backbone of microfluidics and lab-on-a-chip diagnostics.[10,11]

Optical absorptions of many two-dimensional materials, such as graphene and transition metal dichalcogenides, can be modulated through electrostatic potential. This makes two-dimensional materials ideal as the functional layer for electric field sensing because 1) the optical absorption can change due to a local electric potential difference in the target material, and 2) the optical absorption can be externally gated to achieve the critical coupling condition for maximal sensitivity detection. See Horng, Jason, et al. "Imaging electric field dynamics with graphene optoelectronics." Nature Communications 7 (2016).

We use graphene as our functional layer as an example according to some embodiments. The structure of the critical coupled optical platform is illustrated in the right-hand image in FIG. 8. Large-area graphene is grown by chemical vapor deposition and transferred to a prism coated with 150 nm of $Ta_2O_5$ (n=2.0856), forming a high refractive index waveguide. We use an equilateral SCHOTT SF-11 glass (SF-11) prism (n=1.743) with a 1000 nm top layer of $SiO_2$ (n=1.444) as the coupling tool and coupling layer, respectively. A collimated s-polarized 1.55 μm incident beam is coupled into the transverse electric (TE) mode of the waveguide at an oblique angle so that the condition for total internal reflection is satisfied at the SF-11/$SiO_2$ and $Ta_2O_5$/solution interfaces. The reflected light is then collected by an infrared objective and imaged onto an InGaAs camera and photodiode.

To achieve the aforementioned condition $|r_1|=|r_2|$ for critical coupling, we can in situ vary the value of $|r_2|$ by electrical gating of graphene through a Ag/AgCl electrode in the solution. To attain the highest sensitivity to local electric fields, we gate the graphene to a specific Fermi energy that generates the largest relative optical reflection change for a given local electric field. At the critical-coupling condition, the total reflection, R, equals zero, at which point all of the incident light is absorbed by graphene. Consequently, close to the critical coupling condition, the light-graphene interaction is strongly enhanced, the background reflection approaches zero, and the optical readout of small changes in the Fermi energy is sensitively detected.

Figure 3:
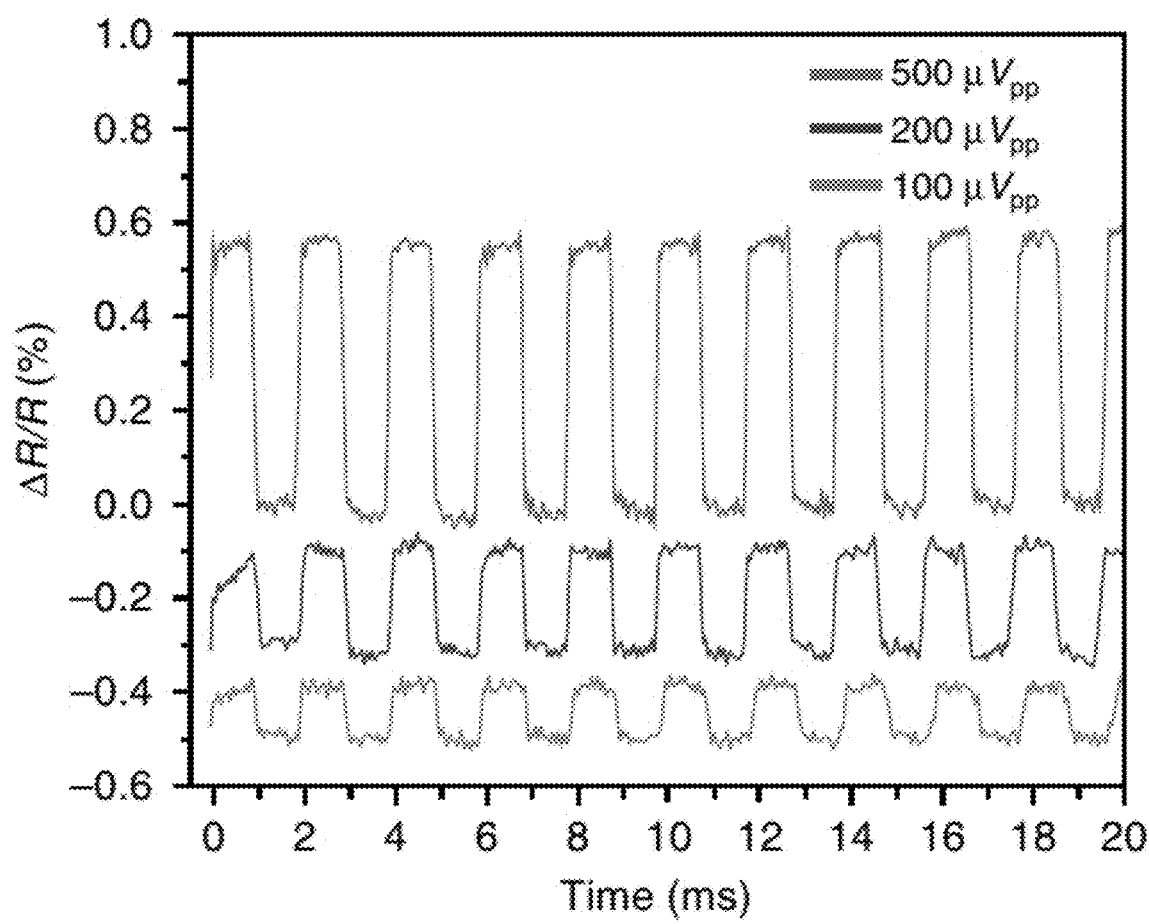
FIG. 3 illustrates optical detection of an applied modulating voltage. A periodic rectangular waveform is applied with peak-to-peak voltages of 500 $\mu V_{pp}$ (green), 200 $\mu V_{pp}$ (purple), and 100 $\mu V_{pp}$ (orange) with a 10 Hz-10 kHz bandpass filter. The optical response from the 100 $\mu V$ applied modulation demonstrates a SNR of 6.5 corresponding to an experimental detection limit of 15 $\mu V$.

In our demonstration using a graphene-based coating, the system enables non-perturbative images of local electric field dynamics to be captured across a wide field of view. We demonstrate highly sensitive optical readout of small time-dependent voltages in FIGS. 3-6. The gate voltage at graphene was set at the highest sensitivity point. We applied periodic rectangular pulse sequences with peak voltages ranging from 500 μV to 100 μV and recorded the optical readout with a wide band-pass filter from 10 Hz to 10 kHz. The results are shown in FIG. 3. The relative reflectance changes are 0.58%, 0.23%, and 0.11% for 500 μV, 200 μV, and 100 μV voltage pulses, respectively. Clear periodic modulation is observed at Vpp=100 μV with a signal-to-noise ratio of 6.5. This measurement reflects detection capabilities of ~15 μV.

Figure 4:
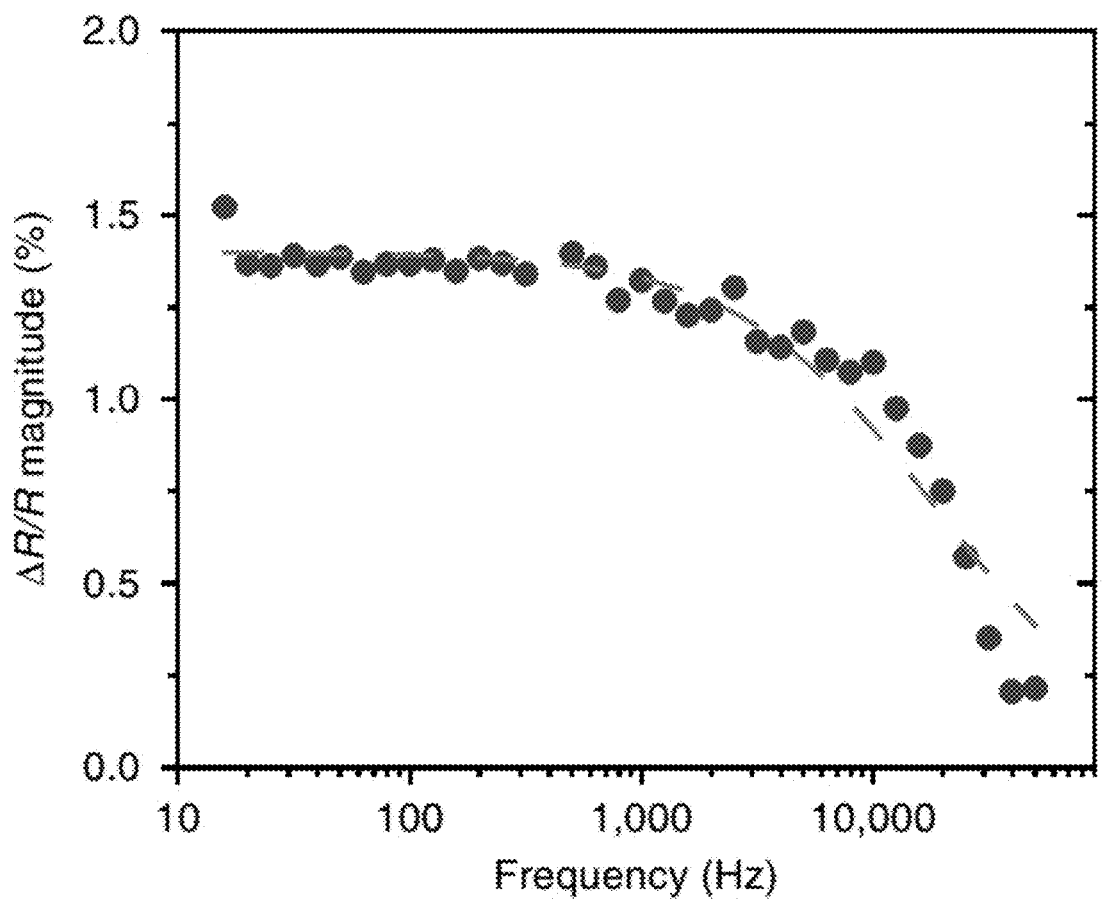
FIG. 4 shows the frequency dependence of the optical signal demonstrating sensitivity to high-speed fluctuations up to 10 kHz. A 1 $mV_{pp}$ sinusoidal waveform with frequencies spanning 20 Hz to 50 kHz is applied. Shown here for a device with large-area (80,000 $\mu m^2$) graphene. The frequency bandwidth will increase inversely with graphene area as a consequence of graphene's high conductivity. The results provided by the equivalent circuit, accounting for the double layer capacitance and graphene resistance, is plotted as the dashed line.
Figure 5:
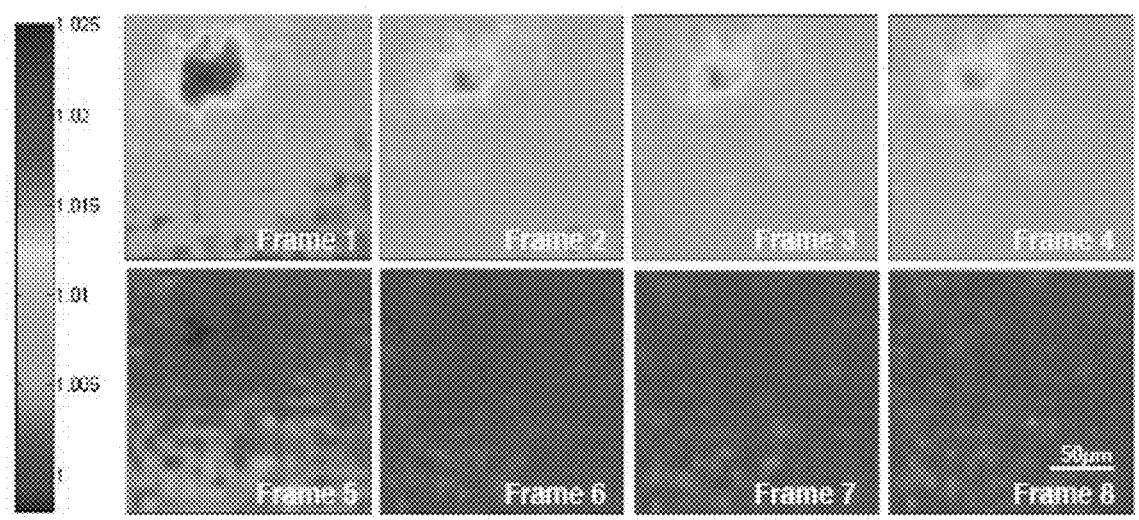
FIG. 5 shows a sequence of images as a source electrode applies a 50 ms pulse above the detector in a saline solution.
Figure 6:
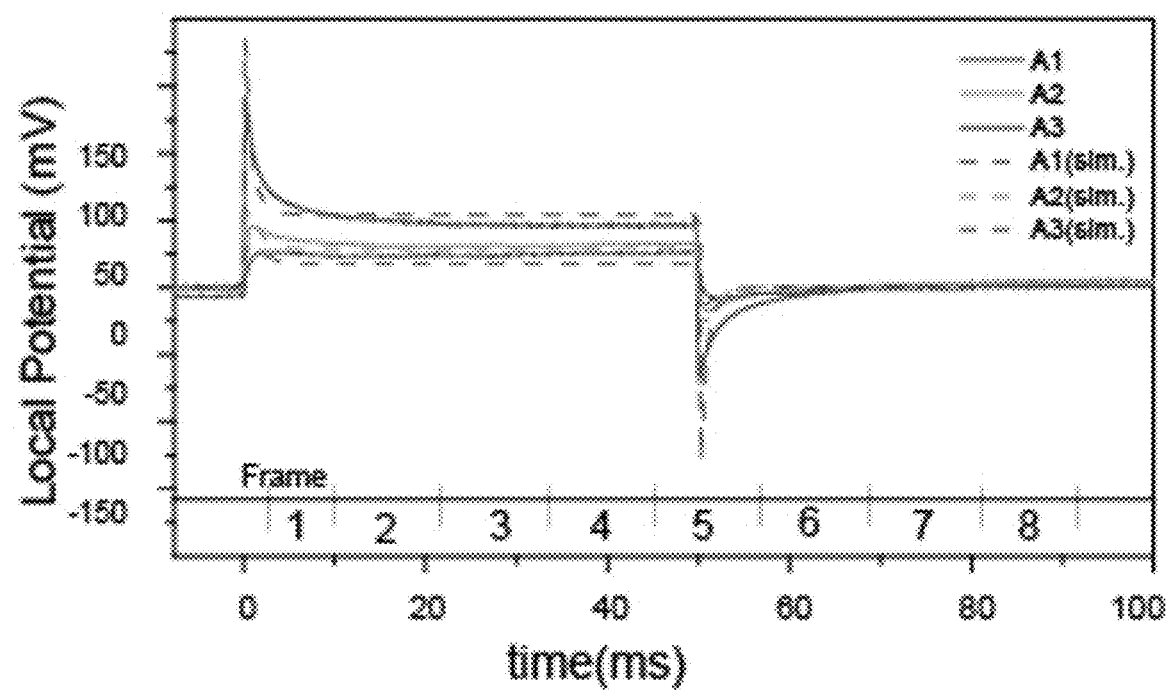
FIG. 6 shows the timing of the frames in FIG. 5 relative to the excitation voltage pulse.

FIG. 4 shows our sensitivity remains constant up to 10 kHz and decreases at higher frequencies. This response speed permits direct observation of electric field dynamics on timescales spanning action potentials to electrophoretic manipulation. FIG. 5 captures a sequence of images as a source electrode applies a 50 ms pulse above the detector in a saline solution. To date, there is no comparable method of spatially resolving the strength and dynamics of the electric field produced in this event. Each frame in FIG. 5 is normalized by an image taken in zero-field. The timing of the frames relative to the excitation voltage pulse is shown at the bottom of FIG. 6. Compared to the recording in FIG. 6, we expect that frames 1-4 capture the period in which a positive transient voltage decreases and spreads to areas away from the excitation electrode, and frames 5-8 capture the period in which a negative transient voltage recovers to zero. Indeed, the data show that a positive voltage spreads out spatially in the first four frames, and a negative voltage recovers to the equilibrium state in the last four frames. These results demonstrate that the dynamic spatial variation of the local electric fields can be imaged in real time using our graphene planar-waveguide platform.

In summary, we present a novel integrated critically coupled cavity resonance microscopy platform with versatile coatings of two-dimensional materials for optically imaging local electric field dynamics with high voltage, spatial, and temporal resolution in ambient solutions.

With 250-fold improvement over conventional graphene based optical sensing, we are able to resolve 15 μV fluctuations with a bandwidth of 10 Hz to 10 kHz across a wide field of view. Furthermore, this platform is highly adaptable and presents a robust platform for label-free, high signal to noise optical readout of local electric fields in dynamic solutions under ambient conditions that may be spectrally tailored to enable broad applications from improved engineering of lab-on-a-chip devices to sensing bioelectric phenomena across cellular networks.

Figure 9:
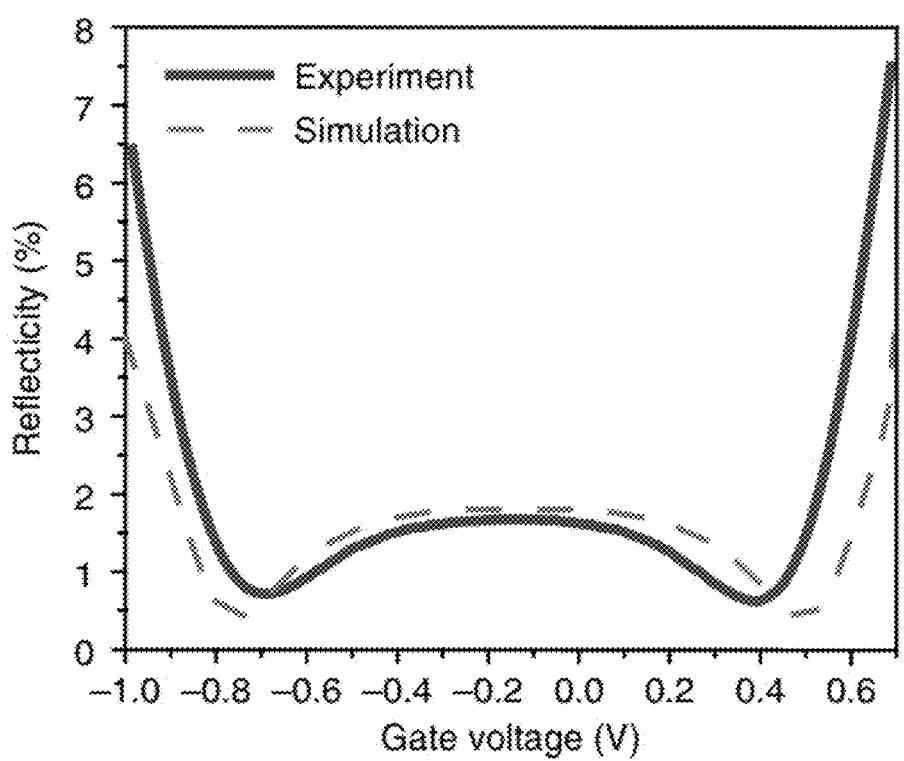
FIG. 9 shows the gate-dependent optical reflectivity of the TE-polarized collimated 1.55 $\mu m$ beam incident at the waveguide resonance angle. The dip in the optical signal corresponds to the critical coupling condition. The dashed line shows the optical response expected from simulation.

FIG. 9 shows the gate-dependent reflectivity response of a typical CAGE detector in a saline solution (solid line). The incident 1.55 μm beam is collimated and TE-polarized. The resonance condition of the waveguide determines the angle of incident light inside the SF-11 coupling prism to be ~60 degrees from normal. With a 1000 nm $SiO_2$ layer, the frustrated total internal reflection $|r_1|$=98.2%. The reflection coefficient at the $Ta_2O_5$/solution $|r_2|$ is 97.5% at the charge neutral point ($V_g$=−0.14V) due to graphene absorption, which leads to a total reflection of R~1.5%. Graphene absorption can be set subsequently by electrostatic gating through the solution. The critical coupling condition $|r_1|=|r_2|$ is realized at $V_g$=+0.41V (electron doped) and $V_g$=−0.69V (hole doped), resulting in the lowest total reflectivity, R. (The residue value of R=0.63% at critical coupling is due in part to a slight divergence in the incident beam and in part due to defects in the CVD-grown graphene and the waveguide thin film deposition.) Further increase of carrier doping leads to a decrease of graphene absorption corresponding to $|r_1|<|r_2|$ and one obtains an increase in total reflectivity. The dashed line in FIG. 9 shows the simulated optical response of the device using graphene absorption determined experimentally. (See Optical Absorption of Monolayer Graphene, below, for graphene absorption and Simulation of Optical Response from Device, below, for simulation details)

Figure 10:
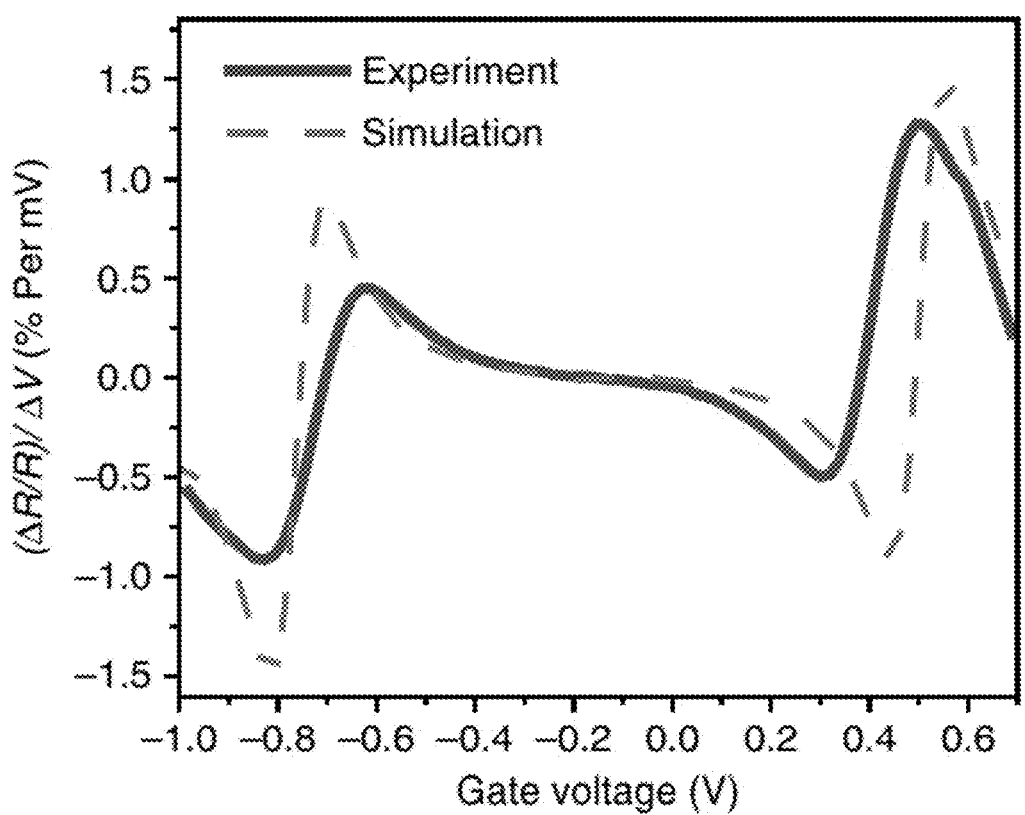
FIG. 10 shows the CAGE sensor voltage sensitivity, (dR/R)/dV, which is derived from the data in FIG. 9 for both experiment (solid line) and simulation (dashed line). We observe a maximum voltage sensitivity of 1.2% optical change per mV at $V_g=\pm0.53V$.

The sensitivity of CAGE detection to dynamics of the local electric field is characterized by the relative reflectivity change dR/R caused by a change in voltage induced by the local electric field, dV. FIG. 10 shows the calculated (dR/R)/dV as a function of the gate voltage from FIG. 9. CAGE detection is most sensitive close to the critical coupling condition, where the greatest optical modulation is achieved for a given change in local electric field. For example, a single millivolt of field-induced voltage produces a 1.2% change in reflection at $V_g$=0.53 V. This sensitivity is over 200 times higher than that of the direct transmission configuration (~1% optical change per 200 mV, see Optical Absorption of Monolayer Graphene, below). The noise of the commercially available 15 mW 1.55 μm butterfly diode lasers is around 0.01% RMS across a 10 Hz-10 kHz bandwidth. Consequently, the CAGE detection permits optical readout of electrical voltages smaller than 10 μV across a wide field of view.

Noise Floor and Bandwidth

CAGE optical detection of small electric field fluctuations is demonstrated in FIG. 3. The gate voltage at graphene was set at the highest sensitivity point (0.53 V). We applied periodic rectangular pulse sequences with peak voltages ranging from 500 μV to 100 μV and recorded the optical readout with a wide band-pass filter from 10 Hz to 10 kHz. The relative reflectivity change is 0.58%, 0.23%, and 0.11% for 500 µV, 200 µV, and 100 µV voltage pulses, respectively. The results are consistent with the (dR/R)/dV=1.2% per mV reported in FIG. 10. Clear periodic modulation is observed at $V_{pp}$=100 µV with a signal to noise ratio (SNR) of 6.5. This measurement reflects optical detection capabilities of ~15 µV or, equivalently, a change of carrier concentration of $2.3 \times 10^8$ electrons per $cm^2$ in graphene. The noise level at 0.017% in FIG. 3 is due to a combination of laser intensity fluctuations and vibrations of optical components. Higher SNR and therefore higher voltage sensitivity would be possible by improving the optomechanical and laser source stabilities.

The temporal response of CAGE detection is determined by the RC constant of the system, where C is the capacitance of the graphene/electrolyte interface and R is governed by graphene conductance. For local electrical field fluctuations, the effective area and capacitance is small and the response speeds can be very high. Experimentally, we characterized the frequency response of the CAGE detector using a relatively large graphene area (200 µm by 400 µm), underscoring the applicability of our measurements to large fields of view. FIG. 4 shows that the dR/R value remains largely constant up to 10 kHz and decreases at higher frequencies. These measurements yield a 3 dB frequency of 13 kHz (FIG. 4 dashed) and an RC constant of 20 µs. This 10 kHz fast response enables direct observation of electric field dynamics on timescales spanning action potentials and electrophoretic manipulation[8,9].

Electric Field Imaging

Figure 11:
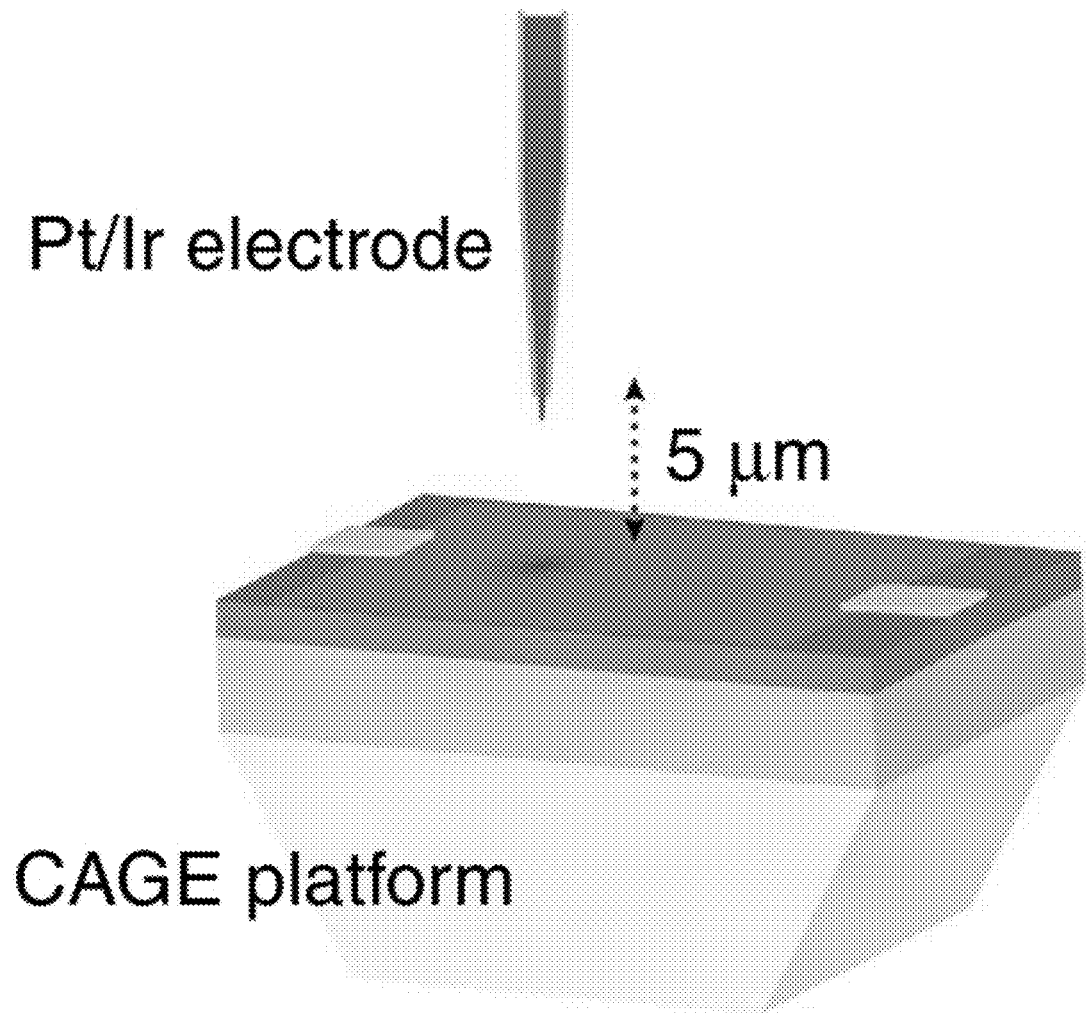
FIG. 11 shows the geometry of the experimental setup in which a waveform is applied to a 2 $\mu m$ platinum/iridium microelectrode placed in solution 5 $\mu m$ above the graphene surface of the detector. Applying a waveform to the microelectrode localizes the electric field and permits observation of the local electric field modulation in space and time.
Figure 12:
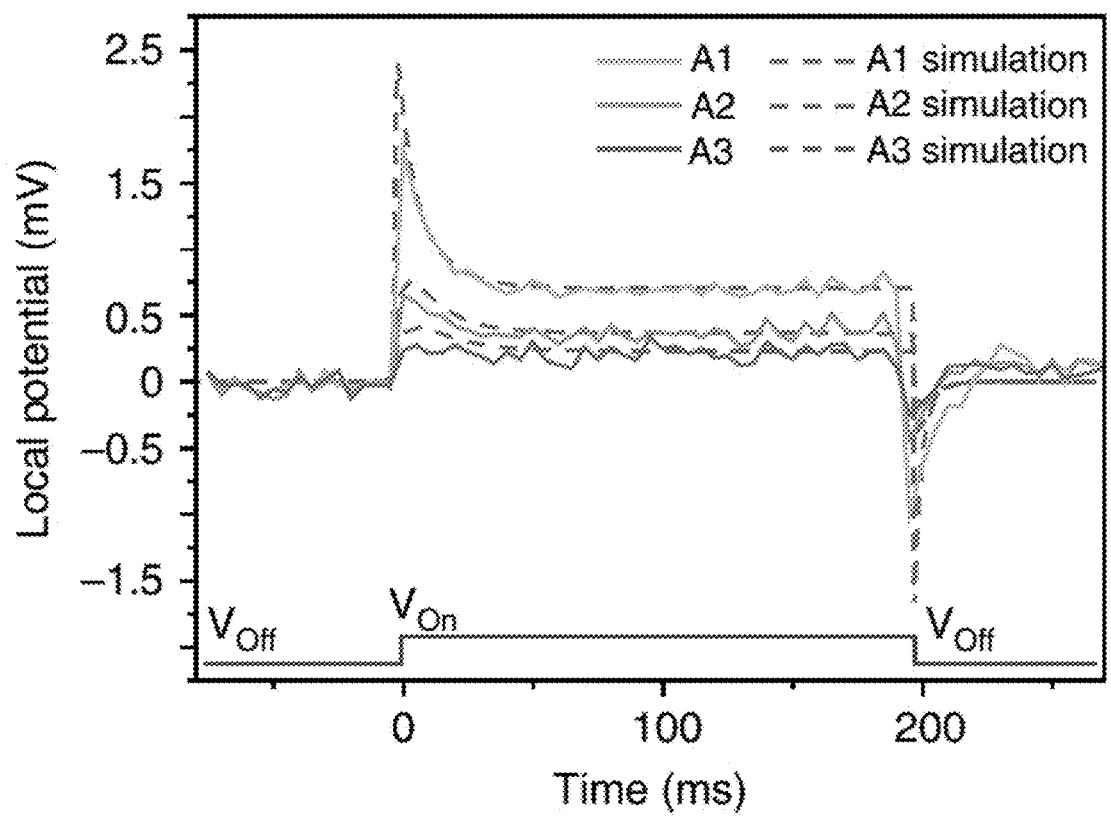
FIG. 12 shows the temporal dynamics of the experimental (solid) and simulated (dashed) optical CAGE detection of the local electric field at different distances from the local potential source. The local field is generated by a 10 mV 200 ms pulse (waveform at the bottom) applied to the microelectrode. The spatial location of A1 (upper curve), A2 (middle curve), and A3 (lower curve) is articulated by white dashed lines in FIG. 13.
Figure 13:
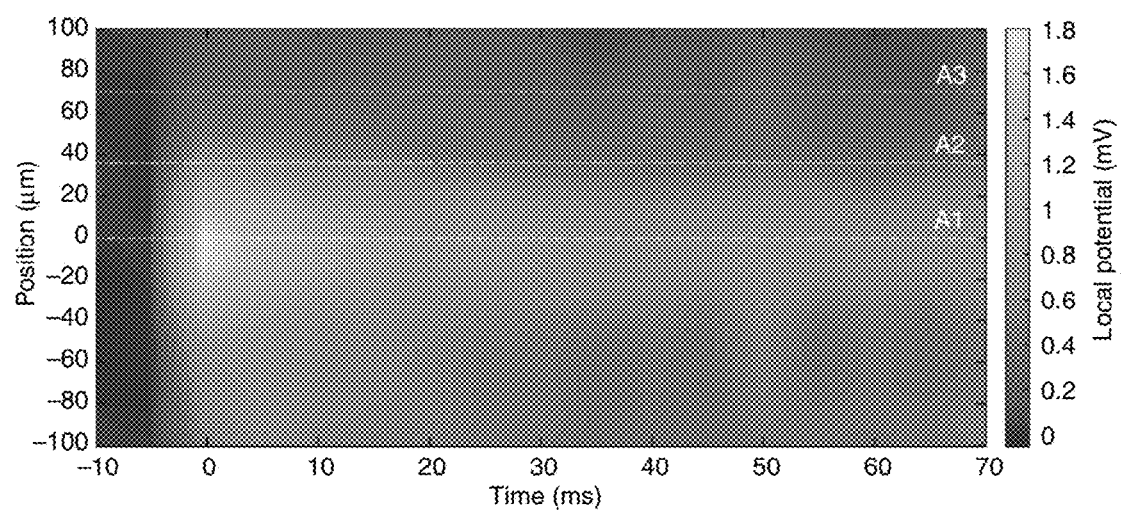
FIG. 13 is a CAGE image with spatio-temporal resolution of the first 70 ms of local electric field dynamics described in FIG. 12 projected onto a 1D 193 Hz InGaAs camera. The spatially resolved recording obtains ~100 $\mu V$ sensitivity with 5 ms temporal resolution.

FIGS. 11-13 demonstrate the capability of CAGE imaging to spatially resolve electric field dynamics. FIG. 11 shows a schematic of the setup. A platinum/iridium microelectrode is placed 5 µm above the device to create a spatially varying electric field distribution. The spatially resolved reflection from the graphene plane is projected to the image plane using a long working distance near-IR objective, which we image onto an InGaAs camera.

The spatio-temporal dynamics of local electric fields in solution are captured by the CAGE device at the critical coupling condition and imaged onto a 1D InGaAs camera array in FIGS. 12 and 13. A 10 mV electrical pulse with a 200 ms duration is applied at the microelectrode (waveform at the bottom of FIG. 12) generating a 1.8 mV local potential at the graphene/solution interface beneath the microelectrode tip (see Finite-Element Simulation of the Microelectrode Voltage Modulation, below).

The temporal response of the local electric field as a function of position is given as time traces in FIG. 12. Positions A1, A2, and A3, are increasingly distant from the field source. At position A1, immediately below the excitation electrode, we observe the perturbed reflection intensity due to a fast transient voltage peak that decays in ~25 ms to a stationary potential (solid upper line). As one moves increasingly distant from the field source, the fast transient peak correspondingly reduces (solid second and third lines). This behavior matches well with the results of our finite element simulation and may be qualitatively described by the equivalent circuit shown in Finite-Element Simulation of the Microelectrode Voltage Modulation, below. This equivalent circuit consists of the solution resistance, impedance from the electrode/solution interface, and the impedance from the graphene/solution interface. The results of the calculation using the equivalent circuit are shown as dashed lines in FIG. 12. The voltage sensitivity is determined by the ~100 µV RMS noise present before the onset of the excitation; this sets the upper bound of voltage resolution in the 1D camera array.

The complete data set of the local field described above is shown in FIG. 13. We observe the field dynamics with 5 ms temporal resolution and 100 µV voltage sensitivity across a full 200 µm. The lower voltage sensitivity in the imaging mode compared with a single InGaAs photodiode is due to the slower speed and a limited dynamic range of our InGaAs array. In the future, the voltage sensitivity and temporal resolution could be extended by adopting a better array detector.

Figure 14:
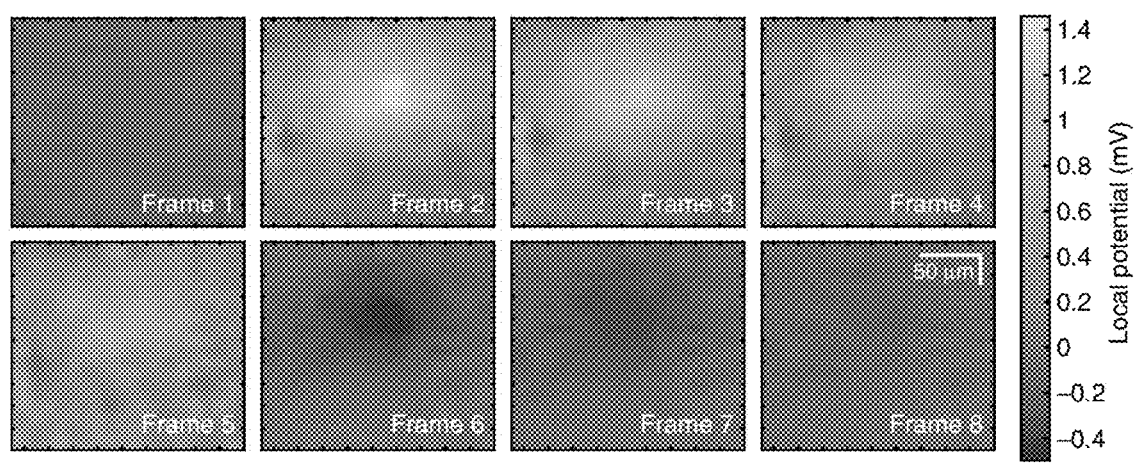
FIG. 14 shows still images from the single-shot recording in response to the same pulse in FIG. 12 projected onto a 2D 80 Hz InGaAs camera.

With the integration of graphene and the critically coupled planar waveguide, we demonstrate a method of imaging local electric field dynamics under ambient conditions with high voltage and spatio-temporal resolution. FIG. 14 shows frames from a video of local electric field dynamics recorded via a two-dimensional (2D) InGaAs camera with our optical platform. An tip electrode with pulsed electrical potential is used to generate the electric field dynamics in a solution. The video shows the capability to capture small electric field dynamics in temporal and spatial domain, demonstrating the device has great potential for bio-electricity sensing and imaging. This label-free and highly parallel technique offers over 200-fold improvement over conventional graphene based optical sensing and resolves sub-15 µV fluctuations with a bandwidth of 10 kHz across a wide field of view.

Frames from a CAGE video of local electric field dynamics recorded via an 80 Hz two-dimensional (2D) InGaAs camera are shown in FIG. 14. Frames 1-4 capture the first 50 ms of the field and its spatial diffusion throughout the solution while frames 5-8 begin at t=190 ms and capture the completion of the pulse and its recovery to equilibrium. The frames are separated by 12.5 ms. The spatial resolution of our device is on the order of 10 µm (see Spatial Resolution of CAGE Imaging Scheme, below). Each frame is normalized by an image taken in zero-field. Compared to the recordings in FIG. 12, we expect that time t=−10 ms to t=40 ms captures the period in which a positive transient voltage emerges and subsequently dissipates away from the excitation microelectrode, and t=190 ms to t=240 ms captures the period in which a negative transient voltage recovers to zero. Indeed, the data show that a positive voltage emerges and then diffuses spatially in frames 1-4, and a negative voltage appears and recovers to the equilibrium state in frames 5-8 (see Finite-Element Simulation of the Microelectrode Voltage Modulation, below). These results demonstrate that dynamic spatial variations of local electric fields can be imaged in real time via the CAGE imaging platform.

In summary, we present a method of imaging local electric field dynamics under ambient conditions with high voltage and spatio-temporal resolution through the critically-coupled waveguide amplified graphene electric field (CAGE) imaging platform. This label-free and highly parallel technique offers over 200-fold improvement over conventional graphene based optical sensing and resolves sub-15 µV fluctuations with a bandwidth of 10 kHz across a wide field of view. The CAGE imaging platform is capable of operating under a wide range of chemical and thermal conditions, may be used simultaneously with complementary measurements, and may be spectrally tailored to enable broad applications from improved engineering of lab-on-a-chip devices to sensing bioelectric phenomena across cellular networks.

Sample Preparation

The CAGE imaging structure according to some embodiments of the invention comprises 1000 nm $SiO_2$ (coupling layer) and 150 nm $Ta_2O_5$ (waveguide layer) deposited on one face of a 1-cm equilateral SF-11 glass prism by ion-assisted deposition. The structure was designed using a custom Python simulation (see Simulation of Optical Response from Device, below) and fabricated by Edmund Optics. A large area graphene film was grown on copper foil using chemical vapor deposition (CVD). A 1-cm² area graphene was transferred onto the waveguide surface by PMMA-supported transfer. We obtain high-quality large-area graphene with near-uniform optical absorption at the device/solution interface.

Figure 7:
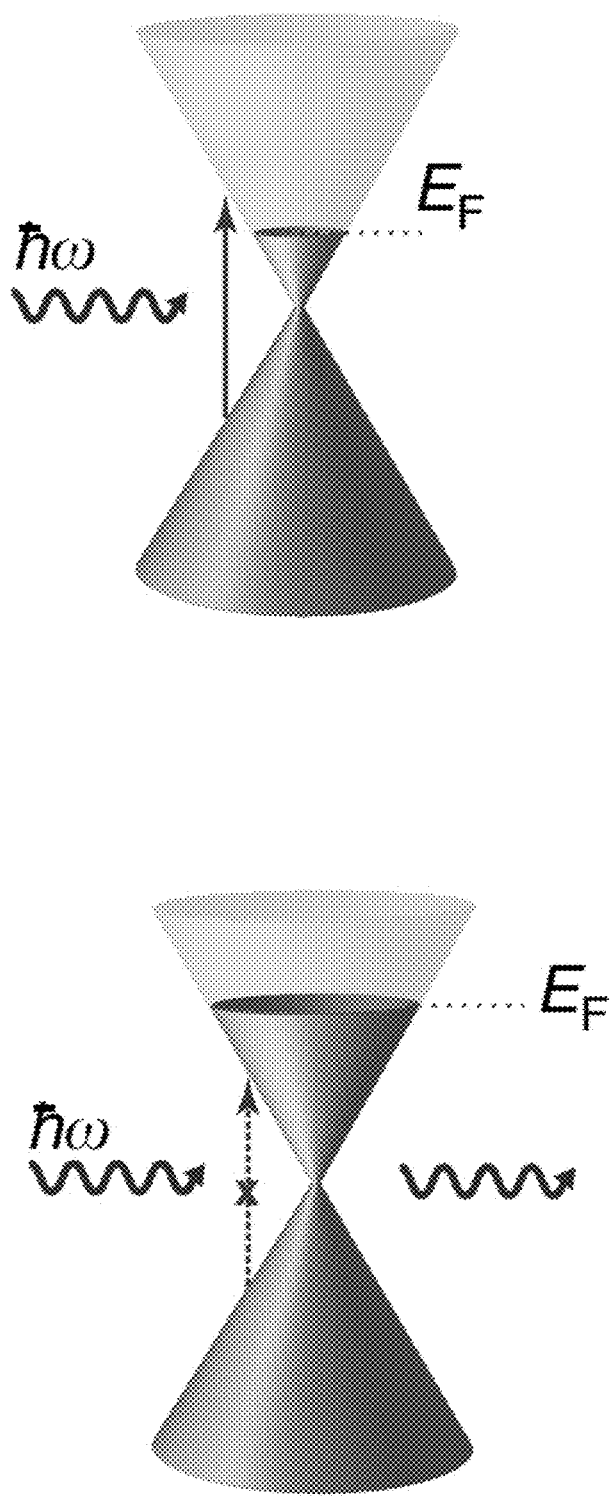
FIG. 7 illustrates graphene interband transitions wherein $E_F$ shifts upon gating. The optical modulation is strongest for electronic transitions near the Fermi surface, $2|E_F|=\hbar\omega$, wherein the presence of an external field can shift the Fermi energy and prohibit optical absorption due to Pauli blocking (bottom).

Pt(2 nm)/Au(60 nm) electrodes were deposited on the graphene to make electrical contacts. The metal electrodes were insulated with nitrocellulose lacquer to prevent water-Au chemical reactions during measurements. The device was mounted in a solution chamber printed from PR48 resin (Autodesk) which permits access to the device from both the top and the bottom. All data were obtained in a saline solution (155 mM NaCl, 2.966 mM $Na_2HPO_4$, 1.0588 mM $KH_2PO_4$) except for imaging data (FIGS. 12 and 13) obtained in 1 mg $L^{-1}$ NaCl in water to accommodate the camera's frame rate. An external gate voltage $V_g$ (0.53 V) was applied through a Ag/AgCl electrode in solution to set the Fermi energy of graphene and to test the optical response of CAGE detection under electrostatic gating. The absorption of the graphene sheet can be modulated through electrostatic gating: a gate-induced shift of the Fermi energy that forbids specific optical transitions in graphene due to Pauli blocking (FIG. 7). We employ this field-dependent optical absorption to achieve highly sensitive and parallel optical detection of local electrical fields.

For the spatially resolved measurements, an external gate voltage $V_g$ (1.1V) was applied through the microelectrode, whose high impedance at the electrode/solution interface requires a larger applied voltage but yields the same voltage bias and critical coupling condition at the detector's graphene/solution interface. A 10 mV electrical pulse generates a 1.8 mV local field at the graphene/solution interface beneath the Pt/Ir microelectrode tip (World Precision Instruments, #PTM23B05KTH) (panel (b) in FIG. 19). To this we applied a small modulation to the micro-positioned microelectrode insulated in parylene with only the final 2 μm exposed to the solution.

Optical Measurements

Figure 15:
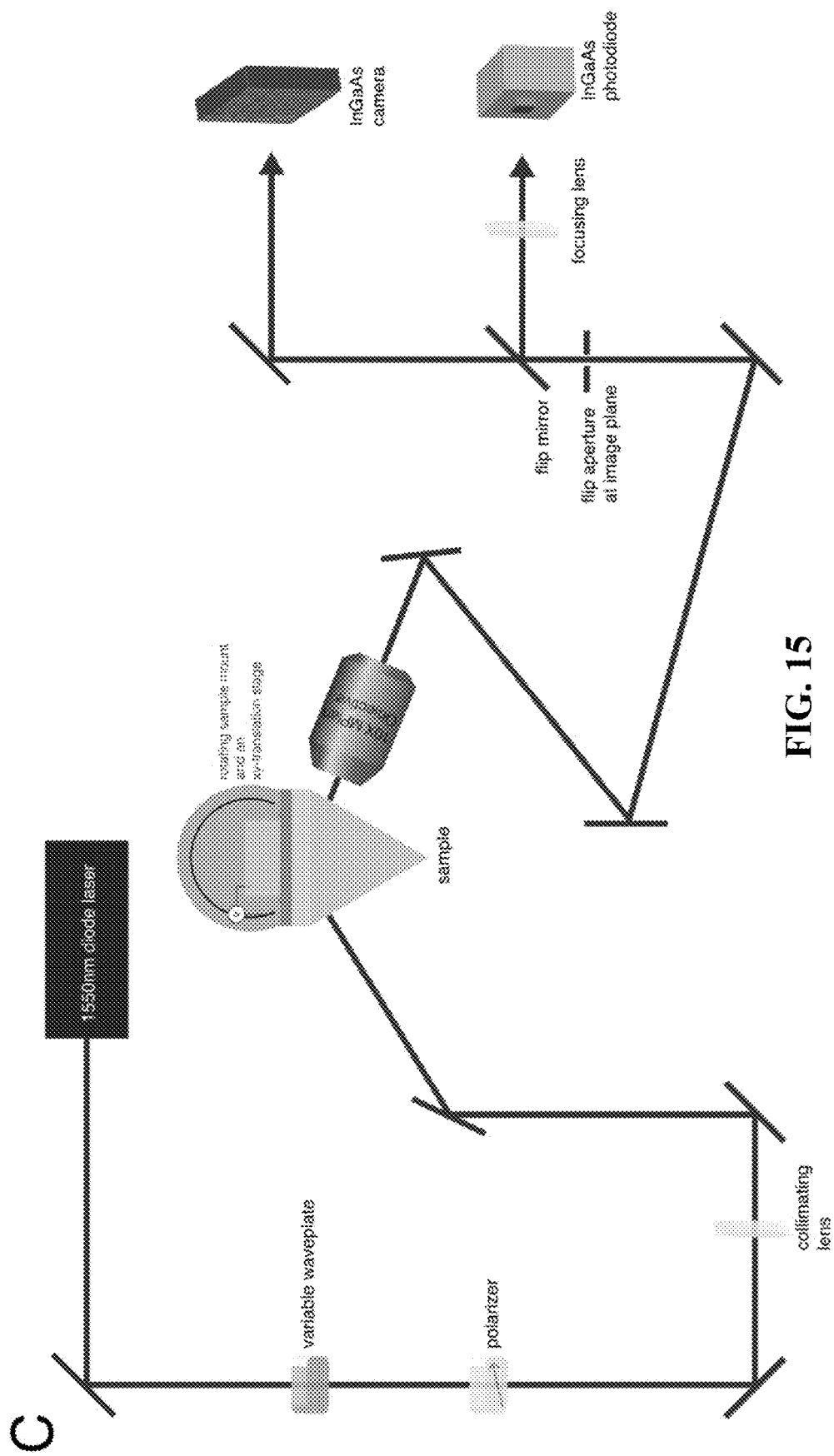
FIG. 15 is a schematic of the optical setup according to some embodiments.

FIG. 15 shows, in detail, the optical set-up used to obtain the measurements disclosed herein. The specific components are provided as an example, and the embodiments of the invention are in no way limited to the components described herein. A stable, 1.55 um, 15 mW laser beam is generated by a butterfly telecomm laser (Newport Model 708 8-Channel Butterfly) with a current and temperature controller (Newport Model 9016 Modular Controller). The polarization is tuned to the TE-direction by a half-wave plate and further cleaned by a calcite polarizer. In the imaging mode, the incident beam is collimated and coupled into the CAGE platform for optimal sensitivity. In the scanning detection mode, the incident beam is controlled with a 17.5 cm focusing lens to have a numerical aperture of 0.002 and selects an area at the graphene interface. The incident light couples into the waveguide from one side of the prism. The prism coated with the planar waveguide is placed on a XY-translational stage and a rotating stage which allow for fine-tuning of the sample position and incident angle. The reflected light is then collected by a 10× MPlan objective and sent into an InGaAs two-dimensional camera (Allied Vision Technologies Goldeye 008 SWIR), an InGaAs one-dimensional camera (Andor 1.7 μm InGaAs DU490A) and into a low-noise InGaAs photodetector, respectively. A circular iris is used to select the probing area for photodiode measurements.

Description of Critically Coupled Waveguide in Graphene Embodiment

FIG. 2 shows a detailed analysis of the waveguide structure according to some embodiments, and describes the working principles of the device. To describe the interaction of the light with the multilayer device, we can separate the system into two sub-systems: one comprising $SF11/SiO_2$ (1000 nm)/$Ta_2O_5$ and one comprising $Ta_2O_5$/Graphene/solution, as each of them form a highly reflecting surface. The sub-systems are shown in the lower panel of FIG. 2. FIG. 15 outlines the optical imaging setup according to some embodiments.

The $SF11/SiO_2$(1000 nm)/$Ta_2O_5$ sub-system can be treated by standard methods of frustrated total internal reflection (FTIR). Here, we assume the reflection and transmission coefficients for light incident from the SF11 side are $r'_1$ and $t'_1$, while the coefficients from the $Ta_2O_5$ side are $r_1$ and $t_1$. One can prove that $|r_1|=|r'_1|$ and $t_1 t'_1 = (1-|r_1|^2)\exp(\delta_1+\delta'_1+\pi)^{36}$, where $\delta_1$ and $\delta'_1$ are the phase of $r_1$ and $r'_1$, respectively.

In the $Ta_2O_5$/Graphene/water sub-system, $r_2$ is defined as the reflection coefficient for light incident from the $Ta_2O_5$ side of the interface. $r_2$ can be calculated with the Fresnel equation and perturbation theory on graphene absorption $$r_2 = 1 - A_{gr} \times \operatorname{Re}\left[\frac{(1+r_2^0)^2}{r_2^0}\right] = 1 - A_{gr} \times 1.66 \qquad [2.1]$$

where $A_{gr}$ is the absorption of graphene, and $r_2^0$ is reflection coefficient at interface of $Ta_2O_5$/water without graphene.

We can now consider the optical properties of the combined system. As these two sub-systems are highly reflective, the combined structure consists of two parallel highly reflected mirrors and may therefore be described as a Fabry-Perot cavity. The total reflected radiation $E_r$ is the interference of the multiple reflections and has the form:

$$\frac{E_r}{E_0} = r'_1 + t_1 t'_1 r_2 e^{i\delta}\left[1 + (r_1 r_2 e^{i\delta}) + (r_1 r_2 e^{i\delta})^2 + \ldots\right] \qquad [2.2]$$

$$= r'_1 + \frac{t_1 t'_1 r_2 e^{i\delta}}{1 - r_1 r_2 e^{i\delta}}$$

where $E_0$ is the incident electric field, $e^{i\delta}$ the phase accumulation as the light propagates through the $Ta_2O_5$ medium. Given the relationship between $r_1$, $r'_1$, $t_1$, $t'_1$, Eqn. [2.2] may be simplified to $$\frac{E_r}{E_0} = e^{i\delta'}\frac{|r_1| - |r_2|e^{i\Delta}}{1 - |r_1||r_2|e^{i\Delta}} \qquad [2.3]$$

where $\Delta = \delta + \delta_1 + \delta_2$ is the round trip phase accumulation in the waveguide. The resonance of the Fabry-Perot cavity takes place at $e^{i\Delta}=1$, which is the same requirement for the zeroth mode for $Ta_2O_5$ planar waveguide.[37] The phase accumulation, $\Delta$, depends sensitively on the incident angle, allowing one to find the resonance of the Fabry-Perot cavity by varying the incident angle coupling into the waveguide structure. By squaring Eqn. [2.3], one can get the reflectance formula shown in Eqn. [1.1] and the critical condition $|r_1|=|r_2|$, at which the reflection intensity dramatically decreases as the light has near-100% absorption into graphene. Operating the device at the critical coupling condition can enhance the contrast significantly due to the strongly enhanced light-matter interaction and the low reflection background.

Optical Absorption of Monolayer Graphene

Figure 16:
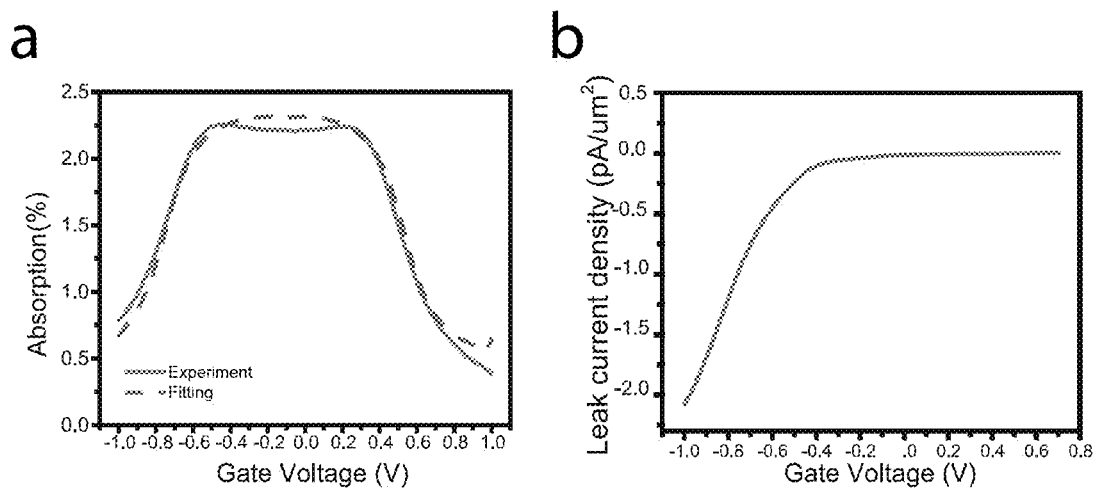
FIG. 16 shows the gate dependence of optical absorption of monolayer graphene.

To optimize the optical response of the CAGE device, we first examined the gate dependence of graphene's optical absorption in an ionic solution. We obtained an optical reflection measurement from monolayer graphene on glass substrate at 1.55 µm with normal incidence as a function of gate voltage through solution with a Ag/AgCl electrode. The absorption is derived from the reflection data based on Fresnel equations and shown in panel (a) of FIG. 16. Panel (a) of FIG. 16 shows the optical absorption measurement with a monolayer graphene on glass substrate at 1.55 µm at normal incidence as a function of gate voltage via Ag/AgCl electrode through saline solution. The absorption at zero-gate voltage is measured to be 2.19%, which is close to the universal optical absorption of graphene (2.3% theoretically). The absorption starts to decrease at around ±0.4V due to the band-filling effect and continues to decrease to ±1.0V. The absorption may be tuned from 0.47% to 2.19% over a gate voltage of ±1.0V.

The optical absorption of graphene, $A_{gr}$, contains contributions from both interband and intraband transitions in graphene. Its frequency dependence at different Fermi energies ($E_F$) can be approximated by[38,39]

$$A_{gr}(E_F) = \frac{\pi e^2}{\hbar c}\left[1 + \frac{1}{\pi}\left(\tan^{-1}\frac{E-2|E_F|}{\Gamma} - \tan^{-1}\frac{E+2|E_F|}{\Gamma}\right)\right] + \frac{4e^2}{\hbar c \tau}\frac{|E_F|}{E^2+(1/\tau)^2} \quad [2.4]$$

where E is the incident photon energy, $\Gamma$, the interband and $1/\tau$ the intraband transition broadening, respectively. The Fermi level $E_F$ varies with the carrier concentration, n, as $E_F=\hbar v_F\sqrt{\pi n}$, where the Fermi velocity $v_F$ is $1.1\times10^6$ m s$^{-1}$. In the electrolytic cell, the averaged carrier concentration, $n_0$, can be described by a capacitor model $n_0=C(V_g-V_{CNP})/e$, where C is the double layer capacitance of the solution under Ag/AgCl gating, and $V_{CNP}$, the charge neutral point, is fitted to be $-0.11$V.

To account for the doping inhomogeneity in graphene, we introduce a local carrier concentration broadening of $\Delta=5\times 10^{11}$ cm$^{-2}$. As a result, the conductivity of graphene can be described as $$A_{gr}(n_0) = \frac{\int A_{gr}(n)e^{-(n-n_0)^2/\Delta^2}dn}{\int e^{-(n-n_0)^2/\Delta^2}dn} \quad [2.5]$$

The fitting results for the graphene absorption as a function of $V_g$ are plotted in panel (a) of FIG. 16 (dashed line), where the fitted parameters both interband and intraband broadening are 80 meV, double layer capacitance C=2.07 µF cm$^{-2}$. From the absorption curve of graphene, we estimate that the voltage sensitivity in a transmission configuration (dT/T)/dV=0.0048% per mV due to intrinsic broadening of graphene interband transitions. The current density on graphene electrodes is monitored during the optical measurement and shown in panel (b) of FIG. 16. The current is small within the window of ±1V and the band-filling effect can be reproduced many times indicating a lack of a chemical reaction between graphene and the PBS solution.

Simulation of Optical Response from Device

To optimize the device structure, we built a custom Python simulation that explored materials, dimensions, tolerances, and coupling conditions to provide theoretical bounds on spatial resolution and field sensitivity. The simulation is based on transfer-matrix formalism. These simulated conditions included polarization and coupling angle of the infrared beam, graphene's optical properties in aqueous solutions, and the structure of planar waveguide layers. Drawing upon these results we found the optimal parameters, compatible with standard fabrication techniques, for the spatial and charge sensitivity.

Figure 8:
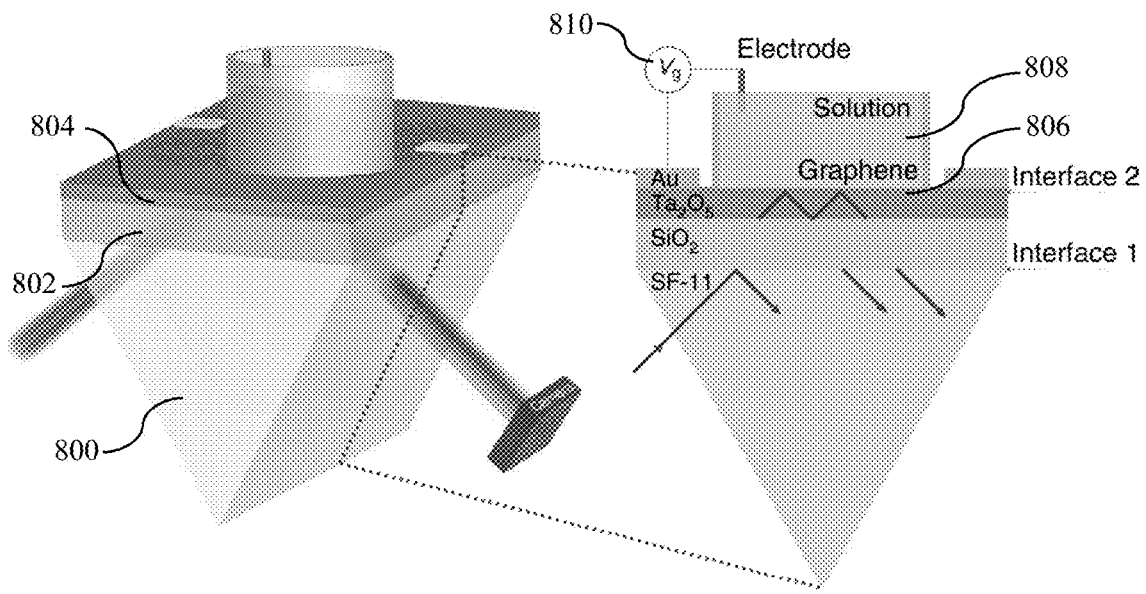
FIG. 8 shows a critically coupled waveguide-amplified graphene electric field (CAGE) imaging device in which a transverse-electric (TE) polarized collimated incident beam at 1.55 $\mu m$ is coupled through the prism coupler into the waveguide.
Figure 17:
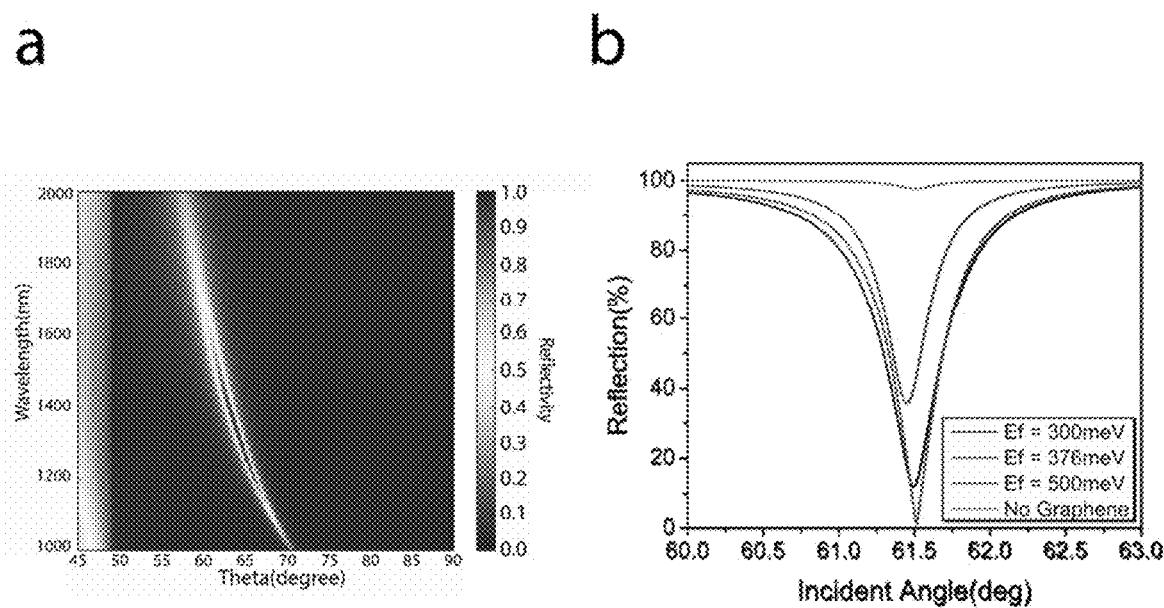
FIG. 17 illustrates simulation of the optical response from the graphene optoelectronic electric field imaging device.

Panel (a) of FIG. 17 shows the reflection map of s-polarized planewaves with various wavelength of light and incident angles from a graphene-coated waveguide structure shown on the left-hand side of FIG. 8. Most of the wavelength and incident angle combinations give unity reflection due to total internal reflection. Only when the incident angle matches the zeroth transverse electric mode (TE mode), can light couple into the waveguide and absorption by graphene becomes significant.

Panel (b) of FIG. 17 shows the reflection of s-polarized planewaves at 1.55 µm from the same waveguide structure as a function of incident angles for different graphene Fermi energies. The depth of resonance dip can be controlled by tuning graphene's Fermi energy via an external gate. The dips in the reflection curves are due to the zeroth transverse electric mode of the waveguide and the depth of resonance peak changes significantly for different Fermi energies of graphene. The optical absorption of graphene decreases monotonically with the Fermi energy and determines the fraction of light being absorbed in the waveguide. The simulation indicates that the strongest (deepest) resonance takes place at one specific Fermi energy (376 meV in panel (b) of FIG. 17). At this Fermi energy, the absorption of graphene is such that the multiple reflections in the waveguide destructively interfere, resulting in a near-zero reflection of the probe beam.

Finally, we simulate optical response in a real experimental setting where the incident angle is fixed at the resonance condition and assuming numerical aperture N.A.=0.002 by averaging the reflectance within the angle divergence (~0.6°). The absorption of graphene used in the simulation is taken from the experimental data from panel (a) in FIG. 16. The simulated voltage-dependent reflectance and sensitivity of the device is shown in FIGS. 9 and 10 as dashed lines, respectively, and may be compared with the experimental responses from the CAGE optical system.

Finite-Element Simulation of the Microelectrode Voltage Modulation

To understand the spatio-temporal behavior of local potential measured in micro-electrode stimulation experiment shown in FIG. 11, we use the Electrochemistry Module in COMSOL Multiphysics to simulate the electric potential in solution during applied voltage pulses. The simulation accounts the effect of the electrode kinetics in addition to solution resistance. The current distribution in electrolyte is assumed to obey Ohm's law and the electrode interface are simulated by a double-layer capacitance together with a linearized Butler-Volmer equation to describe electrode current, namely:

$$i_{el} = i_0 \frac{\alpha F}{RT}\eta \quad [2.5]$$

where $i_{el}$ is the electrode current, $i_0$ the exchange current density, $\alpha$ the cathodic and anodic charge transfer coefficient, F the faraday constant, R the gas constant, T the temperature and $\eta$ the overpotential of the electrode.

In the simulation, we use a 1 μm-radius-disk stimulating electrode with $C=10$ F m$^{-2}$, $i_0=20$ A m$^{-2}$, $\alpha=1$ embedded in an electrolyte with conductivity $\sigma=0.0022$ S m$^{-1}$. The parameters for stimulating electrode are provided by the manufacturer and electrolyte conductivity is from literature. Large-area graphene is set 5 μm away from the stimulating electrode and with parameters: $C=0.02$ F m$^{-2}$ and $i_0=0.05$ A m$^{-2}$. The capacitance and exchange current density for graphene are estimated from the absorption measurement in panel (a) in FIG. 16 and leak current measurement in panel (b) in FIG. 16, respectively. At $t=0$, both graphene and stimulating electrode are set at 0 V, after which a 200 ms pulse with 10 mV magnitude is applied to the stimulating electrode to simulate the experiment described in FIG. 13. The cross-section of simulation geometry and simulated potential distribution in solution at $t=30$ ms is shown in panel (a) of FIG. 18. The color map in panel (a) of FIG. 18 shows the simulated spatial distribution of electrolyte potential at $t=30$ ms during the voltage pulse applied.

Figure 18:
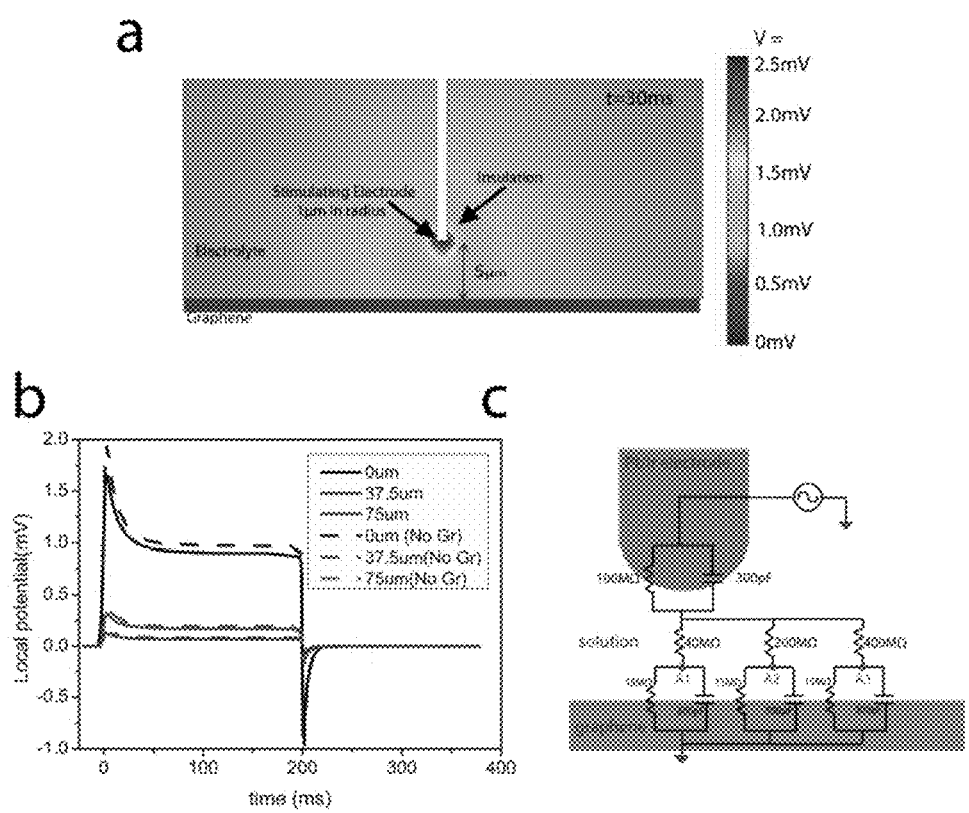
FIG. 18 illustrates a finite-element simulation for microelectrode voltage modulation.

Panel (b) in FIG. 18 shows the voltage dynamics in solution just above graphene for three positions corresponding to A1 (below the tip), A2 (37.5 μm away) and A3 (75 μm away). The simulated local potential dynamics can be compared with the data observed in FIG. 13 and provides a qualitative description for the spatio-temporal phenomenon observed in experiment.

The potential difference with graphene (solid lines) and without graphene (dashed lines) are shown in panel (c) of FIG. 18. The potential difference is within 10%, indicating that the solution and probe are essentially blind to the presence of graphene, and that our detection schema may be treated as a truly nonperturbative readout of local electric fields.

The dynamics of the electric potential in solution can also be qualitatively described by the equivalent circuit shown in panel (c) of FIG. 18. This equivalent circuit comprises the solution resistance, impedance from the electrode/solution interface, and impedance from the graphene/solution interface. The results of the calculation using the equivalent circuit are shown as dashed lines in FIG. 13.

Spatial Resolution of CAGE Imaging Scheme

Figure 19:
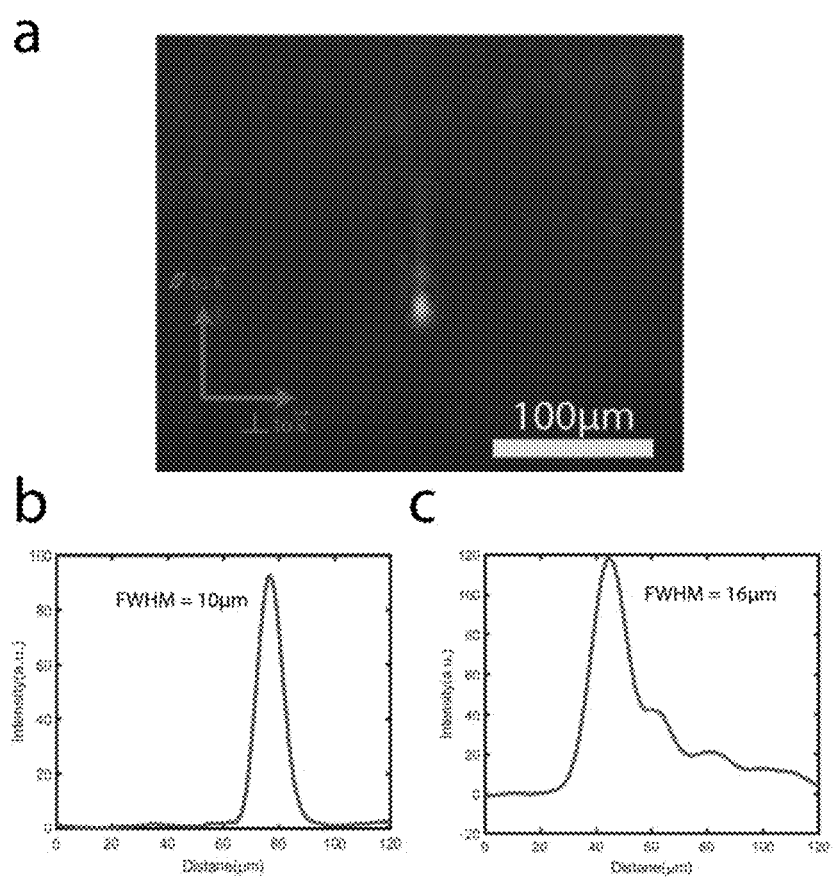
FIG. 19 illustrates calibration of spatial resolution of CAGE imaging system.

To demonstrate the spatial resolution of our CAGE imaging system, we spread polystyrene microspheres (with a 1 μm diameter) on the waveguide surface and analyzed the images formed by a single microsphere. Panel (a) in FIG. 19 shows an image of one microsphere taken with the CAGE optical system. The objective we use in the study is 10× MPlan objective with N.A.=0.26. The resulting lower limit for spatial resolution is 7 μm, which is larger than the diameter of a polystyrene microsphere, therefore the microsphere can be treated as a point source and the intensity profile reports the point spread function of the optical system.

Panel (b) in FIG. 19 shows an intensity profile on a line cut across the direction perpendicular to the light propagation in the waveguide, $\vec{k}$. The full width at half maximum (FWHM) is measured to be 10 μm, which indicates that the spatial resolution in this direction is 10 μm. Panel (c) in FIG. 19 shows an intensity profile on a line cut across the direction parallel to $\vec{k}$. We observe a long tail of ~40 μm in the $\vec{k}_\parallel$ direction. This is due to the slow decay of light over the waveguide propagation distance. The reflection coefficient of the waveguide depends sensitively on the incident angle. As the focused beam has a finite angular spread due to the uncertainty principle, interference is observed as the multiple secondary peaks observed in the $\vec{k}_\parallel$ direction. With graphene as absorber and the waveguide structure according to some embodiments, we estimate that the light decays in the tens of microns length scale which corroborates with the experimental observation. Despite the decay tail, the spatial resolution in the propagation direction determined by the FWHM is 16 μm.

Example 2—Spatially-Resolved Imaging Using Other 2D Materials

A two-dimensional optical sensing platform according to some embodiments of the invention combines unprecedented sensitivity with the capability of two-dimensional optical imaging and high-speed dynamic detection. This platform makes use of a two-dimensional planar waveguide close to the critical coupling conditions, and with the possibility to integrate with layered two-dimensional materials for extended sensing capabilities. It allows for high speed, high sensitivity, and high throughput sensing of a wide range of stimulants, such as chemical and biological adsorbates, electrical fields, PH, and strain, at two-dimensional interfaces.

Some embodiments of the invention combine many desirable features in one platform, including high sensitivity, ease of use, high parallel detection with two-dimensional imaging, high-speed operation, and flexibility for detecting different physical parameters. In comparison, electrical detection based on field effect transistors can be very sensitive, but it usually measures a single point and is difficult to use for parallel detection. Sensing based on one-dimensional waveguides and optical fibers can also be very sensitive, but it is not compatible with highly parallel optical imaging. Conventional wide-field imaging allows for parallel detection, but has much lower detection sensitivity. In addition, the integration with two-dimensional layered materials allows for new modalities such as detection of pH, strain, and electrical field that are difficult for conventional optical sensing.

Second Embodiment—Spatially-Resolved Detection of Local Changes to Refractive Index The waveguide platform can operate in another imaging principle based on the modification of local refractive index at the top surface of the planar waveguide. This operation mode is particularly useful for bio-chemistry and environmental sensing and can have biosensor applications and different lab-on-a-chip sensor applications. The unique abilities of our design for characterizing and quantifying low concentration molecules can have wide impacts in theranostics, pharmaceutics, food safety, environmental monitoring and homeland security.

Figure 20:
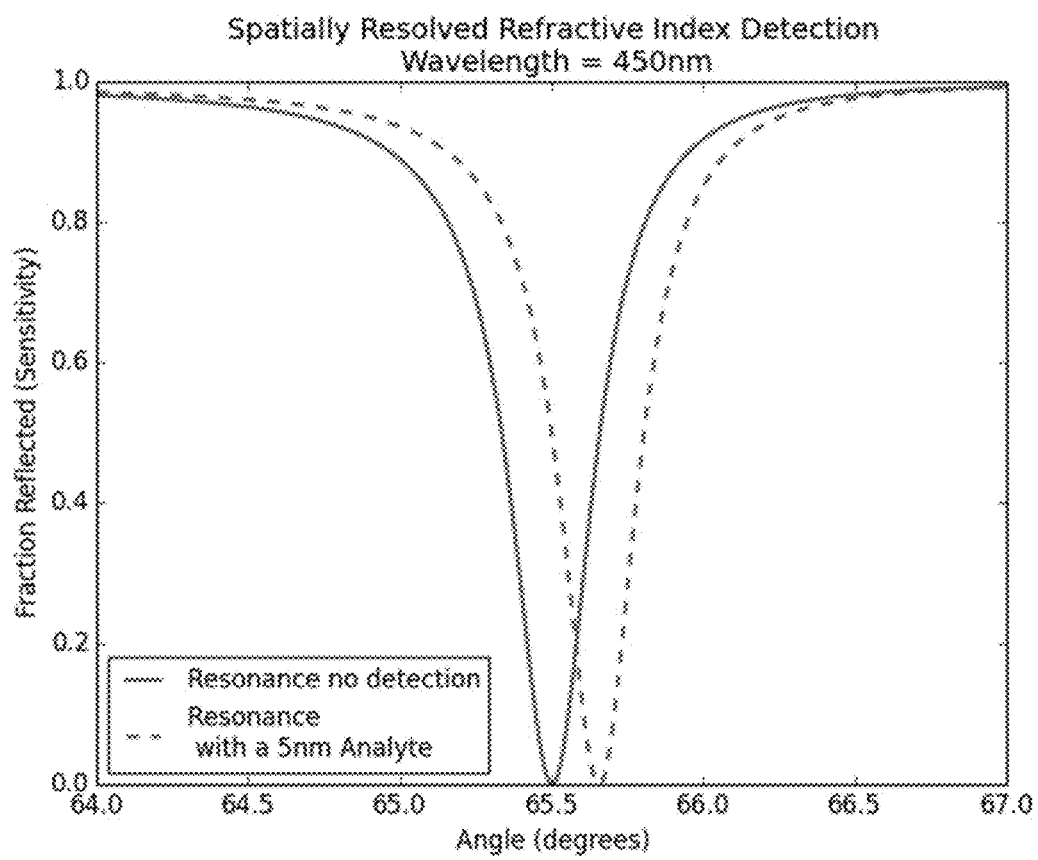
FIG. 20 illustrates spatially-resolved refractive index sensing according to some embodiments of the invention.

Adsorption of small molecules, particles, or chemical binding events, will often lead to a local refractive index modification. The optical resonance energy from the waveguide platform can be shifted due to the phase difference created by the refractive index modification (FIG. 20). At the spatial location of the detection event, the resonance position will shift commensurate with the signal. The detected shift can be interpreted as a variation in the local refractive index change and can be used to infer the molecule concentration, composition, etc.

For a shift sensing technique, the linewidth of the resonance will strongly affect the sensitivity. In our waveguide platform, the linewidth of the resonance can be controlled by fine tuning of the thickness of the coupling layer.

Description of Spatially-Resolved Refractive Index Sensing

Light propagating along the interface between the planar waveguide and the target is used to sense the refractive index changes at the waveguide surface. While the local environment of the waveguide is modified, for example, when a biomolecule binding event occurs on top of the waveguide, the local refractive index is modified. If light undergoes a constructive interference when it propagates through a planar waveguide, the total phase change for a guided wave that bounces once between the two interfaces must be a multiple of $2\pi$, expressed as $$2k_0 n_1 d \sin\theta - 2\phi_{12} - 2\phi_{13} = 2m\pi, \; m=0, 1, 2, \ldots \quad [3.1]$$

where $k_0$ is the light wavevector in vacuum, $n_1$, $d$ are the refractive index and the thickness of the planar waveguide, m is the mode number, $\phi_{12}$ and $\phi_{13}$ are the phase changes upon the total internal reflection at the interfaces. The resonance energy and angle $\theta$ of the waveguide will be shifted due to the phase difference created by the refractive index modification on top of the waveguide. Given an electromagnetic wave with a certain wavelength propagates in the planar waveguide, the phase difference from each total internal reflection accumulates and leads to an overall large change in the resonance angle. The sensing depth is on the order of the penetration depth of the evanescent waves from the waveguide and can be well designed to optimize the detection scheme.

In some embodiments of the invention, one can use either a narrowband light source and an imaging detector to monitor the resonance angle shift or a broadband light source and a spectrometer to identify the resonance energy shift, for example. The detected resonance shift can be interpreted as a variation in the local refractive index change and can be used to infer the molecule concentration, composition, etc.

As an optical sensing technique, the linewidth of the resonance will strongly affect the sensitivity. In our waveguide platform, we can control the linewidth of the resonance by tuning the thickness of the coupling layer. In general, the linewidth of the resonance becomes narrower as one increases the thickness of the coupling layer. However, the suitable linewidth for detection has to take the intrinsic absorption and inhomogeneity of fabricated waveguide into account.

The selectivity of this imaging mode is provided by the functional layer. The functional layer can be chemically-selective, geometrically-selective, or selective based on electric or magnetic signatures. The selectivity of this functional layer is not limited to those listed here which are only examples of the selectivity that can be employed in this functional layer.

As an optical platform for detecting, observing, and imaging small changes in refractive index, this system and method can have better performance than the widely adopted surface plasmon resonance (SPR) sensing for biomolecules detection. Embodiments of the invention can provide better sensitivity to refractive index change and are more flexible in terms of design parameters, such as surface composition and photon wavelength. This new platform can be used to understand dynamics of chemical reactions that have not been previously understood, and can also lead to sensitive biochemical assays with various ligands, proteins, and membranes.

Our planar waveguide sensor platform offers several possible advantages compared to SPR. (1) Our waveguide is made of dielectric materials which have much less absorption less than metals. (2) The dispersion of our waveguide resonance can be chosen at any wavelength by properly designing the waveguide refractive index and thickness. (3) Dielectric materials can be chosen to have correct thermo-optic compensation to remove the temperature dependence of the waveguide resonance. (4) Our planar waveguide platform is capable of combining imaging methods to allow spatial-temporal monitoring of refractive index changes.

Application—Biochemical Analysis and Environmental Sensing

When the waveguide is functionalized with certain chemical acceptors, one can detect donor dynamics in solution. When donor molecules bind to the acceptors at the interface, the local refractive index will be changed. The optical resonance energy from the waveguide platform can be shifted and the detected shift can be interpreted as variation in the donor molecule concentration. With the capability to identify chemicals and map their concentration in a solution, one can integrate the platform with current lab-on-a-chip diagnostics devices for optical detection of analytes, which can lead to faster or more sensitive functional analysis.

Some embodiments of the invention can be used in different variations. One example may be for biological imaging, where the waveguide is sensitized with antibodies or other anchor molecules that allow sensitive detection of very few binding events. The functional layer can be used to sensitize the waveguide with antibodies or other anchor molecules. Another example may be for imaging small amounts of chemical formation at the waveguide interface with high sensitivity and spatial resolution.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

REFERENCES

1. Plonsey, R. (Duke U. & Barr, R. C. *Bioelectricity A Quantitative Approach.* (Springer, 2002).
2. Cohen, A. E. & Venkatachalam, V. Bringing bioelectricity to light. *Annu. Rev. Biophys.* 43, 211-32 (2014).
3. Gagnon, Z. R. Cellular dielectrophoresis: Applications to the characterization, manipulation, separation and patterning of cells. *Electrophoresis* 32, 2466-2487 (2011).
4. Çetin, B. & Li, D. Dielectrophoresis in microfluidics technology. *Electrophoresis* 32, 2410-2427 (2011).
5. Link, D. R. et al. Electric Control of Droplets in Microfluidic Devices. *Angew. Chemie Int. Ed.* 45, 2556-2560 (2006).

6. Hunt, T. P., Issadore, D. & Westervelt, R. M. Integrated circuit/microfluidic chip to programmably trap and move cells and droplets with dielectrophoresis. *Lab Chip* 8, 81-87 (2008).
7. Yuste, R. From the neuron doctrine to neural networks. *Nat. Rev. Neurosci.* 16, 487-497 (2015).
8. Xie, C., Lin, Z., Hanson, L., Cui, Y. & Cui, B. Intracellular recording of action potentials by nanopillar electroporation. *Nat. Nanotechnol.* 7, 185-90 (2012).
9. Buzsáki, G., Anastassiou, C. a & Koch, C. The origin of extracellular fields and currents—EEG, ECoG, LFP and spikes. *Nat. Rev. Neurosci.* 13, 407-20 (2012).
10. Dorfman, K. D., King, S. B., Olson, D. W., Thomas, J. D. P. & Tree, D. R. Beyond Gel Electrophoresis: Microfluidic Separations, Fluorescence Burst Analysis, and DNA Stretching. *Chem. Rev.* 113, 2584-2667 (2013).
11. Zhang, C., Khoshmanesh, K., Mitchell, A. & Kalantarzadeh, K. Dielectrophoresis for manipulation of micro/nano particles in microfluidic systems. *Anal. Bioanal. Chem.* 396, 401-420 (2010).
12. Lambacher, A. et al. Electrical imaging of neuronal activity by multi-transistor-array (MTA) recording at 7.8 μm resolution. *Appl. Phys.* A79, 1607-1611 (2004).
13. Hutzler, M. et al. High-Resolution Multitransistor Array Recording of Electrical Field Potentials in Cultured Brain Slices. *J. Neurophysiol.* 96, 1638-1645 (2006).
14. Lavis, L. D. & Raines, R. T. Bright ideas for chemical biology. *ACS Chem. Biol.* 3, 142-55 (2008).
15. Li, L. S. Fluorescence probes for membrane potentials based on mesoscopic electron transfer. *Nano Lett.* 7, 2981-2986 (2007).
16. Park, J. et al. Screening Fluorescent Voltage Indicators with Spontaneously Spiking HEK Cells. *PLoS One* 8, e85221 (2013).
17. Miller, E. W. et al. Optically monitoring voltage in neurons by photo-induced electron transfer through molecular wires. *Proc. Natl. Acad. Sci. U.S.A.* 109, 2114-9 (2012).
18. K W Park, et al. Single Molecule Quantum-Confined Stark Effect Measurements of Semiconductor Nanoparticles at Room Temperature. *ACS Nano* 6(11) 10013-10023 (2012).
19. Einevoll, G. T., Kayser, C., Logothetis, N. K. & Panzeri, S. Modelling and analysis of local field potentials for studying the function of cortical circuits. *Nat Rev Neurosci* 14, 770-785 (2013).
20. Angle, M. R., Cui, B. & Melosh, N. A. Nanotechnology and neurophysiology. *Large-Scale Rec. Technol.* 32, 132-140 (2015).
21. Spira, M. E. & Hai, A. Multi-electrode array technologies for neuroscience and cardiology. *Nat Nano* 8, 83-94 (2013).
22. Wang, Y., Shan, X., Wang, S. & Tao, N. Imaging Local Electric Field Distribution by Plasmonic Impedance Microscopy. (2016).
23. Nair, R. R. et al. Fine Structure Constant Defines Visual Transparency of Graphene. *Science* (80-.). 320, 1308-1308 (2008).
24. Wang, F. et al. Gate-variable optical transitions in graphene. *Science* 320, 206-209 (2008).
25. Mak, K. F., Ju, L., Wang, F. & Heinz, T. F. Optical spectroscopy of graphene: From the far infrared to the ultraviolet. *Solid State Commun.* 152, 1341-1349 (2012).
26. Liu, M. et al. A graphene-based broadband optical modulator. *Nature* 474, 64-67 (2011).
27. Koester, S. J. & Li, M. Waveguide-Coupled Graphene Optoelectronics. *Sel. Top. Quantum Electron. IEEE J.* 20, 84-94 (2014).
28. Majumdar, A., Kim, J., Vuckovic, J. & Wang, F. Electrical Control of Silicon Photonic Crystal Cavity by Graphene. *Nano Lett.* 13, 515-518 (2013).
29. Shiue, R.-J. et al. Enhanced photodetection in graphene-integrated photonic crystal cavity. *Appl. Phys. Lett.* 103, (2013).
30. Gan, X. et al. Strong enhancement of light-matter interaction in graphene coupled to a photonic crystal nanocavity. *Nano Lett.* 12, 5626 (2012).
31. Grigorenko, A. N., Polini, M. & Novoselov, K. S. Graphene plasmonics. *Nat Phot.* 6, 749-758 (2012).
32. Chen, J. et al. Optical nano-imaging of gate-tunable graphene plasmons. *Nature* 3-7 (2012).
33. Fei, Z. et al. Gate-tuning of graphene plasmons revealed by infrared nano-imaging. *Nature* 487, 82-85 (2012).
34. Lee, S. H., Choi, J., Kim, H.-D., Choi, H. & Min, B. Ultrafast refractive index control of a terahertz graphene metamaterial. *Sci. Rep.* 3, 2135 (2013).
35. Liu, Y. et al. Approaching total absorption at near infrared in a large area monolayer graphene by critical coupling. *Appl. Phys. Lett.* 105, (2014).
36. Zhu, S., Yu, A. W., Hawley, D. & Roy, R. Frustrated total internal reflection: A demonstration and review. *Am. J. Phys.* 54, 601-607 (1986).
37. Jackson, J. D., *Classical electrodynamics 3rd edition* 385 (Wiley India Pvt. Limited, 2007).
38. Wang, F. et al. Gate-Variable Optical Transitions in Graphene. *Science* 320, 206-209 (2008).
39. Horng, J. et al. Drude conductivity of Dirac fermions in graphene. *Phys Rev B* 83, 165113 (2011).
40. Haynes, W. M. & Lide, D. R. *CRC handbook of chemistry and physics: a ready-reference book of chemical and physical data* D-221 (CRC Press, 2011).

We claim:
1. An optical sensing system, comprising:
   a planar optical waveguide having a first surface for detection and a second surface for coupling light;
   a functional layer integral with said first surface of said planar optical waveguide;
   a coupling layer in contact with said second surface of said planar optical waveguide, said coupling layer having a lower refractive index than said planar optical waveguide;
   an optical source arranged to illuminate at least a portion of said second surface of said planar optical waveguide through said coupling layer with substantially critical optical coupling; and
   an optical detector arranged to receive a portion of light from said optical source after being reflected from said first surface of said planar optical waveguide and passing through said coupling layer,
   wherein said functional layer is a two-dimensional material layer, and
   further comprising a voltage source electrically connected to said two-dimensional material layer for providing electrical gating to said two-dimensional material layer.
2. The optical sensing system of claim 1, wherein said functional layer is responsive to at least one environmental physical, mechanical, chemical, or biological parameter to be detected.
3. The optical sensing system according to claim 1, wherein said functional layer is a graphene layer.

4. The optical sensing system according to claim 1, wherein said optical detector is a point optical detector or a one-dimensional or two-dimensional array detector.

5. The optical sensing system according to claim 1, wherein said optical sensing system further comprises a coupling tool,
wherein said coupling tool optically couples said planar optical waveguide and said coupling layer to said optical source and said optical detector.

6. The optical sensing system according to claim 1, wherein said coupling layer comprises $SiO_2$.

7. The optical sensing system according to claim 1, wherein said functional layer is at least two two-dimensional material layers stacked on top of each other.

8. The optical sensing system according to claim 1, wherein said planar optical waveguide comprises a layer of $Ta_2O_5$.

9. The optical sensing system of claim 8, wherein said layer of $Ta_2O_5$ has a thickness of about 150 nm.

10. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein a surface of said functional layer that is opposite to said surface that is integral with said first surface of said planar optical waveguide is in contact with a solution,
and wherein said optical sensing system provides two-dimensional time-resolved imaging of an electric field distribution in said solution.

11. The optical sensing system of claim 10, wherein said optical sensing system has a voltage sensitivity of at least 15 mV.

12. The optical sensing system of claim 10, wherein said optical sensing system has a spatial resolution of at least 16 μm.

13. The optical sensing system of claim 10, wherein said optical sensing system has a spatial resolution of at least 10 μm.

14. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein said optical detector is an imaging detector to detect light from identifiable locations across a portion of a surface of said planar optical waveguide.

15. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein said optical detector is configured to detect an electric field or voltage change proximal to said functional layer based on said received portion of light.

16. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein said optical sensing system further comprises a coupling tool,
wherein said coupling tool optically couples said planar optical waveguide and said coupling layer to said optical source and said optical detector, and
wherein said coupling tool is a prism or a grating.

17. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein said functional layer has a surface area of at least 1 $cm^2$.

18. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
wherein said optical source is configured to illuminate said at least a portion of said second surface of said planar optical waveguide with a collimated optical beam.

19. An optical sensing system, comprising:
a planar optical waveguide having a first surface for detection and a second surface for coupling light;
a functional layer integral with said first surface of said planar optical waveguide;
a coupling layer in contact with said second surface of said planar optical waveguide, said coupling layer having a lower refractive index than said planar optical waveguide;
an optical source arranged to illuminate at least a portion of said second surface of said planar optical waveguide through said coupling layer with substantially critical optical coupling; and
an optical detector arranged to receive a portion of light from said optical source after being reflected from said first surface of said planar optical waveguide and passing through said coupling layer,
further comprising a translational stage on which said planar optical waveguide, said functional layer, and said coupling layer are mounted,
wherein said optical detector is a one-dimensional detector.

* * * * *